United States Patent
Ma et al.

(10) Patent No.: US 10,760,162 B2
(45) Date of Patent: Sep. 1, 2020

(54) ELECTROLESS COPPER PLATING POLYDOPAMINE NANOPARTICLES

(71) Applicant: The Research Foundation for the State University of New York, Binghamton, NY (US)

(72) Inventors: Siyuan Ma, Vestal, NY (US); Liang Liu, Vestal, NY (US); Vadim Bromberg, Niskayuna, NY (US); Timothy Singler, Binghamton, NY (US)

(73) Assignee: The Research Foundation for The State University of New York, Binghamton, NY (US)

( * ) Notice: Subject to any disclaimer, the term of this patent is extended or adjusted under 35 U.S.C. 154(b) by 0 days.

(21) Appl. No.: 16/414,453

(22) Filed: May 16, 2019

(65) Prior Publication Data
US 2020/0157684 A1  May 21, 2020

Related U.S. Application Data

(63) Continuation of application No. 14/965,468, filed on Dec. 10, 2015, now Pat. No. 10,294,567.

(Continued)

(51) Int. Cl.
*C09D 11/10* (2014.01)
*C23C 18/16* (2006.01)
(Continued)

(52) U.S. Cl.
CPC ......... *C23C 18/1607* (2013.01); *B41M 3/006* (2013.01); *C09D 11/10* (2013.01);
(Continued)

(58) Field of Classification Search
CPC .................................................. C23C 18/1607
(Continued)

(56) References Cited

U.S. PATENT DOCUMENTS

2005/0231476 A1* 10/2005 Armstrong .............. A63F 13/06
  345/161
2010/0019908 A1*  1/2010 Cho ................. G06K 19/07749
  340/572.7

(Continued)

OTHER PUBLICATIONS

Giovanni Mondin, Functionalization of Particles and Selective Functionalization of Surfaces for the Electroless Metal Plating Process, May 28, 2014, The TU Dresden (Year: 2014).*

(Continued)

*Primary Examiner* — Stanley Tso
(74) *Attorney, Agent, or Firm* — Hoffberg & Associates; Steven M. Hoffberg

(57) ABSTRACT

Aqueous dispersions of artificially synthesized, mussel-inspired polydopamine nanoparticles were inkjet printed on flexible polyethylene terephthalate (PET) substrates. Narrow line patterns (4 µm in width) of polydopamine resulted due to evaporatively driven transport (coffee ring effect). The printed patterns were metallized via a site-selective Cu electroless plating process at a controlled temperature (30° C.) for varied bath times. The lowest electrical resistivity value of the plated Cu lines was about 6 times greater than the bulk resistivity of Cu. This process presents an industrially viable way to fabricate Cu conductive fine patterns for flexible electronics at low temperature, and low cost.

20 Claims, 12 Drawing Sheets

Related U.S. Application Data

(60) Provisional application No. 62/090,668, filed on Dec. 11, 2014.

(51) Int. Cl.
| | | |
|---|---|---|
| *C23C 18/18* | (2006.01) | |
| *C23C 18/20* | (2006.01) | |
| *C23C 18/40* | (2006.01) | |
| *C23C 18/44* | (2006.01) | |
| *H05K 3/18* | (2006.01) | |
| *C09D 11/322* | (2014.01) | |
| *B41M 3/00* | (2006.01) | |
| *C23C 18/31* | (2006.01) | |
| *H05K 1/03* | (2006.01) | |
| *H05K 1/09* | (2006.01) | |
| *H05K 3/12* | (2006.01) | |

(52) U.S. Cl.
CPC ........ *C09D 11/322* (2013.01); *C23C 18/1608* (2013.01); *C23C 18/1689* (2013.01); *C23C 18/1893* (2013.01); *C23C 18/2086* (2013.01); *C23C 18/31* (2013.01); *C23C 18/40* (2013.01); *C23C 18/44* (2013.01); *H05K 3/182* (2013.01); *C23C 18/1851* (2013.01); *C23C 18/2006* (2013.01); *H05K 1/0306* (2013.01); *H05K 1/0346* (2013.01); *H05K 1/097* (2013.01); *H05K 3/125* (2013.01); *H05K 3/1275* (2013.01); *H05K 2201/0154* (2013.01); *H05K 2201/09236* (2013.01); *H05K 2203/0709* (2013.01); *H05K 2203/0786* (2013.01); *H05K 2203/1173* (2013.01)

(58) Field of Classification Search
USPC .......................................................... 174/268
See application file for complete search history.

(56) References Cited

U.S. PATENT DOCUMENTS

| | | | |
|---|---|---|---|
| 2015/0077293 A1* | 3/2015 | Korva | H01Q 1/243 343/702 |
| 2015/0289366 A1* | 10/2015 | Frey | G06F 3/041 174/250 |
| 2017/0200840 A1* | 7/2017 | Dressick | H01L 21/02565 |

OTHER PUBLICATIONS

Giovanni Mondin, Metal Deposition by Electroless Plating on Polydopamine Functionalized Micro- and Nanoparticles, Journal of Colloid and Interface Science, Aug. 28, 2013, vo. 411, pp. 187-193. (Year: 2013).*

* cited by examiner

ELECTROLESS COPPER PLATING POLYDOPAMINE NANOPARTICLES

CROSS REFERENCE TO RELATED APPLICATIONS

The present application is a Division of U.S. patent application Ser. No. 14/965,468, filed Dec. 10, 2015, now U.S. Pat. No. 10,294,567, issued May 21, 2019, which is a Non-provisional of, and claims benefit of priority under 35 U.S.C. § 119 from, U.S. Provisional Patent Application No. 62/090,668, filed Dec. 11, 2014, the entirety of which are each expressly incorporated herein by reference.

FIELD OF THE INVENTION

The present invention relates to the field of electroless plating, and more particularly electroless plating on a substrate to form conductive patterns.

BACKGROUND OF THE INVENTION

Emerging flexible electronic devices have exhibited significant potential for a wide range of applications such as solar cells (1), batteries (2), sensors (3), antennas (4), and displays (5). For any flexible electronic application, an essential characteristic is electrically conductive patterning. Solution-based additive manufacturing techniques such as drop-on-demand (DOD) inkjet printing (6), slot die coating (7), and gravure printing (8) are being widely investigated to fabricate flexible conductive patterns. DOD inkjet printing is an excellent candidate because it is a material-conservative, low-temperature process and is easily incorporated into large scale roll-to-roll (R2R) manufacturing infrastructures for flexible polymer substrates.

The commonly used ink materials in DOD inkjet printing processes can be categorized into two types: metal nanoparticle (NP) dispersions and metal precursor solutions (9, 82). NP inks consist of metallic NPs and a carrier liquid solvent. The NPs have specifically designed surface properties which allow them to be stably dispersed in an appropriate solvent. Precursor ink is an inorganic metal salt or organic metal complex that is dissolved in a solvent. After inkjet printing, the solvent undergoes evaporation and metal NP or precursor deposits on the substrate. A post-printing process is typically necessary to render either type of deposited structure electrically conductive. Polymer capping layers and surfactants are employed in the formulation of NP inks to prevent aggregation and particle precipitation; these agents are generally neither conductive nor volatile. The post-printing process removes these agents and initiates sintering, thereby improving the electrical conductivity. For precursor inks, the post-printing process chemically reduces the metal species from its ionic to elemental state which is electrically conductive. The standard post-printing process applies heat that potentially puts substrate materials at risk of thermal degradation/deformation, especially when low-cost polymeric substrates are used (e.g., polyethylene terephthalate (PET), etc.). A few non-thermal or local surface thermal techniques have been reported including plasma (10, 11), laser (12), electrical (13), and photonic (14) methods. However, sophisticated equipment and their associated high-cost processes are inevitable.

Drop-on-demand inkjet printing is a material-conservative deposition process compatible with the low temperature requirements of flexible polymer substrates (81). The implementation of printing within a roll-to-roll (R2R) infrastructure enables continuous, high-speed and large-scale manufacturing.

Electroless plating generally uses a solution of metal salt, reducing agent, a complexing agent, and additive(s) (such as bath stabilizer and plating rate adjusting agent)(20). Metal nucleates on the catalytically active surface and continues to promote further metal reduction and growth. This is the defining characteristic of ELP's autocatalytic nature (20). A pre-patterned catalyst layer on the target substrate will promote site-selective deposition. Hidber et al. (86) utilized microcontact stamping to pattern palladium (Pd) colloids which yielded copper (Cu) patterns after ELP. Harkness et al. (87) used photolithography to pattern a Pd-bonded-organic seed layer (hydrogen silsesquioxane) and achieved site selective ELP of Cu and Ag. The prohibitively large cost of photolithography has prompted research into the use of inkjet printing to directly pattern the catalyst (88, 89, 90, 91, 92, 93, 94). Most of the inkjet printing studies exploited Pd-based ink (88, 89, 90, 91, 92) while the investigation of other ink materials is less focused (93, 94). Although Pd-based catalyst is versatile for electroless plating of a wide range of metals, the high cost of Pd limits its use (95).

Silver (Ag) is the most broadly investigated conductive ink material due to its low bulk resistivity ($1.6\times10^{-8}$ $\Omega$m) and resistance to oxidation; however, like other noble metals, it is expensive ($0.708/gram) (15). Copper (Cu) is preferred because it exhibits a bulk resistivity ($1.7\times10^{-8}$ $\Omega$m) comparable to Ag but is significantly cheaper ($0.007/gram) (15). However, the main challenge of using Cu-based raw material for inkjet printing arises from the spontaneous formation of Cu oxides; when synthesized Cu NPs oxidize, both their resistivity and sintering temperature increase dramatically (9). Research efforts to overcome the Cu NP oxidation have taken two directions: utilizing an organic oxygen barrier material as particle capping layers to retard oxidation kinetics (16) and synthesis of Cu-noble metal core-shell NPs to achieve long-term stability (17). Cu precursor inks are usually stable against oxidation under room environment (18). Notwithstanding, the postprinting process for both Cu NP and Cu precursor must be implemented in reductive, inert atmospheres or under vacuum to prevent oxide formation, which inherently increases process complexity (19). Site-selective Cu electroless plating (ELP) is a method that can be used to fabricate conductive patterns on flexible substrates. It is a low temperature process that does not cause substrate damage if a proper plating bath is used. During ELP, formation of Cu oxides is dramatically inhibited. The general ELP uses a solution of metal salt, complexing agent, reducing agent and additive(s) (such as a bath stabilizer and a pH adjusting agent) (20).

Site-selective ELP can be achieved by plating a substrate which has a prepatterned catalyst/seed layer. Studies have been conducted exploring inkjet printing for ELP seed patterning (21, 22, 23). The Pd-based ink is the most widely investigated material due to its well-established catalytic activity for initiation of various metal deposition from a wide range of ELP solutions (24).

Poly(dopamine) (PDA), a marine mussel inspired polymer, was recently found capable of initiating metal ion reduction indicating its potential as an ELP catalyst (26, 67, 96). PDA exhibits universal adhesion as demonstrated for a wide range of both organic and inorganic materials (26). PDA can be synthesized as continuous coatings on any object by inducing dopamine polymerization in a pure water phase (26) or as suspended spherical NPs in water-alcohol mixtures at controlled pH (27).

Poly(dopamine) nanoparticles (PDA-NP) have been inkjet printed on both glass and PET substrates followed by site-selective Ag ELP (28). Results exhibit a substrate-independent method to fabricate highly conductive Ag patterns.

The coffee ring effect is due to capillary flow induced by the differential evaporation rates across the drop: liquid evaporating from the contact line ("CL") region is replenished by liquid from the interior (29). When the CL is pinned and maximum evaporation occurs at or near the CL, the mass flow of solvent causes an accumulation of solute in the CL region. The resulting bulk flow toward the CL can transport nearly all the dispersed material to the CL region. The cooling due to evaporation induces a Marangoni flow inside a droplet opposing the evaporatively-driven flow. The Marangoni flow, if strong, favors particle deposition at the center region of the droplet. Thus, for particles to accumulate in the CL region, the liquid must have a weak Marangoni flow, or something must occur to disrupt the flow. For example, surfactants can be added to reduce the liquid's surface tension gradient, disrupting the Marangoni flow. Water has an intrinsically weak Marangoni flow, a flow that is then reduced significantly by natural surfactants.

SUMMARY OF THE INVENTION

The present technology provides site-selective Cu plating on inkjet-printed PDA-NP lines on polyethylene terephthalate (PET) substrates.

It is an object to provide a method for forming a conductive trace on a substrate wettable by a volatile liquid, comprising: providing a suspension of nanoparticles in the volatile liquid, the nanoparticles comprising a catalyst for electroless plating; selectively depositing the suspension of nanoparticles in the volatile liquid on the substrate in a pattern, wherein at least a portion of the substrate remains dry; drying the volatile liquid, to form a pattern of nanoparticles on the substrate; and selectively electroless plating the nanoparticles, to form a conductive metal pattern corresponding to the selective deposition pattern of the suspension of nanoparticles.

It is also an object to provide a substrate having at least one conductive trace, formed by a process comprising: providing a substrate having a surface wettable by a volatile liquid; selectively depositing a suspension of nanoparticles, the nanoparticles comprising a catalyst for electroless plating, on the surface in a pattern, wherein at least a portion of the substrate remains free of the suspension; drying the volatile liquid, to form a pattern of nanoparticles on the substrate; and selectively electroless plating the nanoparticles, to form a conductive metal pattern corresponding to the selective deposition pattern of the suspension of nanoparticles on the surface.

It is a still further object to provide a substrate having electrically interconnecting conductive traces, comprising: a surface wettable by an aqueous solution; a plurality of catalytic nanoparticles deposited on the wettable surface in a pattern of parallel lines separated by a region of sparse catalytic nanoparticle deposition; and an electroless plating of a conductive metal selectively forming conductive traces over the parallel lines of catalytic nanoparticles, and being electrically insulating between the respective parallel lines.

It is another object to provide a device, comprising: a substrate having a surface, at least a portion of which are hydrophilic; a pattern of deposited catalytic nanoparticles on the surface, comprising a pattern of parallel lines spaced by a region of sparse catalytic nanoparticle deposition; and electrolessly plated metal selectively formed proximate to the catalytic nanoparticles, forming conductive traces over the parallel lines of catalytic nanoparticles, and being electrically insulating between the respective parallel lines.

The catalytic nanoparticles may comprise polydopamine, and the electrolessly plated metal may comprise copper.

The substrate may comprise a polyimide sheet, or glass, for example. The device may be used to replace indium-tin-oxide transparent conductors, for example in flat panel displays, solar cells, touchscreens, and the like. These conductors may also be used to form electrodes for thin film transistors and other active devices, such as light emitting diodes and organic light emitting diodes. The substrate may have various sets of parallel lines formed on it, in various patterns, such as linear arrays, rectangular arrays, spirals, or other geometric pattern or arbitrary configurations. The parallel lines may advantageously be used as electrodes between ends of carbon nanotubes and other "1-dimensional" structures. In some cases, the fibers may be present in the volatile liquid, and self-align during evaporation across the gap between the edges. In other systems, the fibers may be provided after the electroless copper plating (or other metallic plating) is conducted.

The conductive lines may be used as electrodes in an electrowetting lens system, in which the meniscus formed between two liquids is changed in shape based on electrical potential, and thus providing electronically varying focal length. Further, the technology may also be used in other types of electro-optics, and human eyewear, to provide effectively transparent conductive functionality. For example, an electrically-controlled polarizer may be provided, for 3D television light shutter glasses and optical sunglasses (for example, which can be normally polarized, but "turned off" to view a cell phone or automotive display).

The technology also permits printing of the volatile solution suspension of catalytic nanoparticles. For example, an aqueous solution of polydopamine particles may be deposited from a print head (e.g., ink jet, bubble jet, extrusion) as part of an additive manufacturing process. The volatile solvent is permitted to evaporate, forming the double line structure by virtue of the coffee ring effect. Note that it is also possible to form a filled pattern by avoiding fulfilling the conditions that lead to a sparse gap between the edges. An electroless plating solution may then be sprayed over the catalytic nanoparticle pattern, for form a conductive structure. The electroless solution may then be washed away, and further manufacturing steps conducted. The resulting device may, using appropriate additive manufacturing materials, be optically clear, and therefore the conductors may be embedded in a lens or window. The manufacturing process may deposit, for example, liquid crystal materials, organic light emitting materials, or the like to form functional devices such as polarizers, light shutters, displays, etc.

A printed device may be, for example, a "lab on a chip" design, in which the parallel lines may act as one or two electrodes of a sensor or connecting to a sensor material or device.

The line pattern may also be used to produce an antenna or inductor, or complex devices such as electronic filters and transformers.

The line patterns may also be used as embedded sensors, such as capacitive, stress and strain, piezoelectric, pyroelectric, etc. Thus, for example, a polyvinylidene fluoride (PVDF) or vinylidene fluoride (VDF), trifluoroethylene (TrFE) substrate may be coated with sensing lines, to provide a room temperature thermal movement imaging sensor, at low cost.

The technology may also be used for produce "smart windows", for example with electrochromic darkening.

The nanoparticles may comprise polydopamine or other catalytic material.

The suspension of nanoparticles may be selectively deposited by inkjet printing, lithography, or a pad printing process.

The suspension of nanoparticles may be aqueous, and selectively deposited by selectively forming hydrophobic and hydrophilic regions on the substrate, and the hydrophilic regions wet with the suspension. The volatile liquid may be aqueous, and the drying may comprise evaporating the suspension in air.

The electroless plating may comprise plating the nanoparticles with silver, copper, gold, or nickel, for example.

The selectively depositing the suspension of nanoparticles may comprise inkjet printing a line, evaporating the volatile liquid to redistribute the nanoparticles exploiting the spontaneous coffee ring effect to induce a higher concentration of nanoparticles at the edges of the inkjet-printed line and a sparse distribution of nanoparticles between the edges.

The electroless plating, e.g., over the coffee ring-effect separated pairs of parallel lines of catalytic nanoparticles may form a pair of separated conductive traces at the edges of the inkjet-printed line.

The electroless plating may comprise electroless copper plating, resulting in a continuous reduced copper trace on the substrate.

BRIEF DESCRIPTION OF THE DRAWINGS

FIGS. 2A-2C show structural and electrical performance characterization of the deposit, in which FIG. 2A shows Cu thickness ($\tau$) evolution; FIG. 2B shows individual twin line resistance; and FIG. 2C shows individual twin line resistivity change as a function of Cu electroless plating time (t).

FIGS. 4A-4D show robustness characterization of the inkjet printed polydopmaine nanoparticle (PDA-NP) lines followed by 15 min Cu electroless plating, in which FIG. 4A shows twin line resistance change after cyclic bending; FIG. 4B shows results of a tape peel adhesion test; FIG. 4C shows the influence of air exposure time on plated line resistance (R) relative to its as-plated resistance (R0) (the inset is the first 4 h air exposure result as indicated by the arrow); and FIG. 4D shows a SEM images show the formation of cracks after 10,000 bending cycles with 2.5 mm bending radius.

FIG. 7A shows a polydopamine nanoparticle suspension is inkjet printed on a substrate, and forms a domed pattern corresponding to the deposition droplet locations; FIG. 7B shows the pattern after the liquid dries, wherein the coffee ring effect causes the nanoparticles to selectively deposit the nanoparticles at the edges of the original liquid range; and FIG. 7C shows the result after the polydopamine nanoparticles are electrolessly plated with copper.

FIGS. 9A-9D show a scheme for forming conductive traces on a substrate, in which FIG. 9A shows poly(dopamine) nanoparticles (PDA-NP) that were prepared as aqueous ink and inkjet printed on glass substrate; FIG. 9B shows a pattern of PDA-NP formed after evaporation; FIGS. 9C and 9D show silver electroless plating for short and long time, respectively.

FIGS. 11A-11C show deposited structural characterizations of: FIG. 11A, individual-line resistance (R) as a function of silver electroless plating time, FIG. 11B, thickness ($\tau$) evolution at different locations; FIG. 11C, electrical resistivity change at the edges and interlines. The inserts of (c) are the hypothesized parallel resistor models. The subscript e and i refer to edge and interline, respectively.

DETAILED DESCRIPTION OF THE PREFERRED EMBODIMENTS

Example 1

PDA-NP was synthesized according to a published protocol (27) with minor modification. The ink was formulated by mixing PDA-NP with distilled deionized (DI) water at a concentration of 0.25 wt % followed by 10 min ultrasonication (3510, Branson). The particle size distribution and zeta potential were characterized by dynamic light scattering (DLS) (ZetasizerNano, Malvern). The PDA-NP average diameter was about 340±55 nm. The zeta potential of PDA-NP was measured as −31.0±0.5 mV, indicative of good stability of the ink dispersion. Particle precipitation was not observed over a 30-day period.

The viscosity and surface tension were measured as 1.0±0.1 mPa·s by a rotary viscometer (TA1000, TA Instruments) and 72.1±0.1 mN/m by a bubble tensiometer (BP100, Kruss), respectively. These values were close to those of pure water due to the very small PDA-NP loading.

Figure 1A:
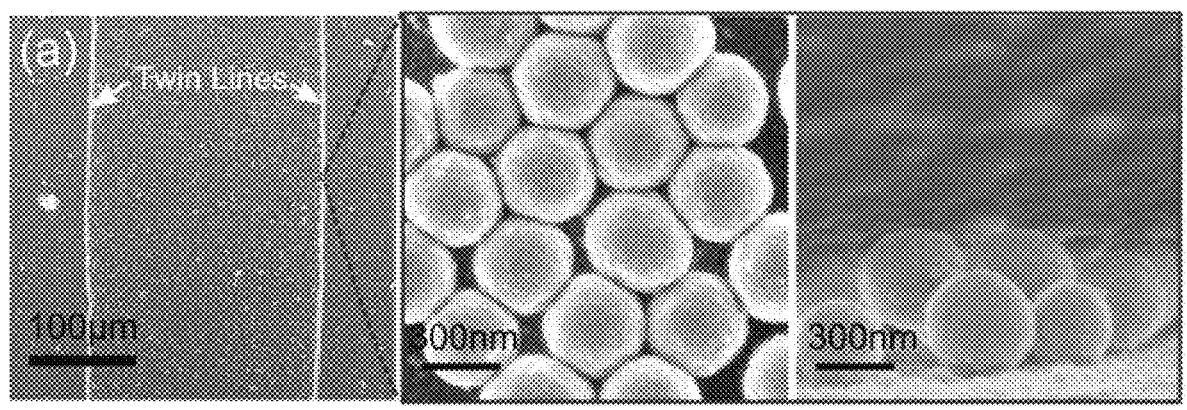
FIGS. 1A and 1B shows typical scanning electron microscope (SEM) images of printed lines of polydopamine nanoparticles (FIG. 1A) and lines subject to 15 min copper electroless plating (FIG. 1B).
Figure 1B:
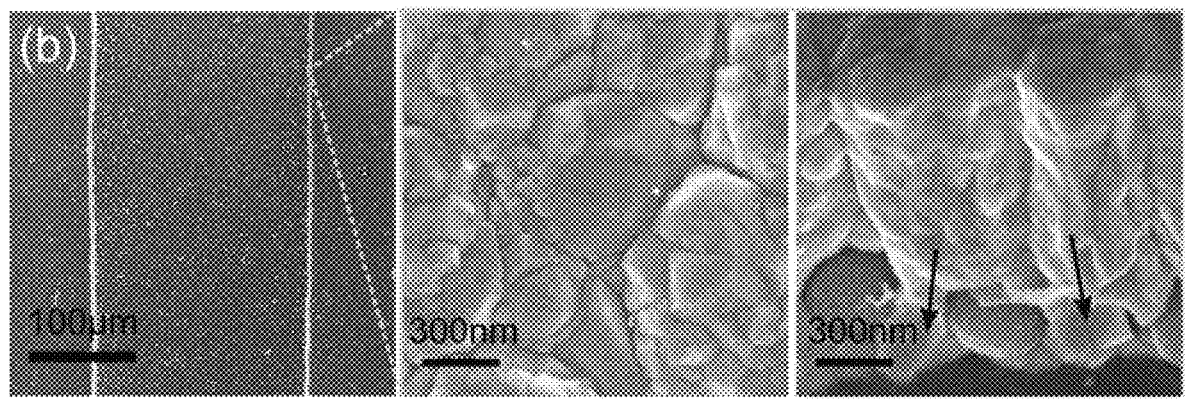

FIGS. 1A and 1B show typical scanning electron microscope (SEM) images of printed lines of polydopamine nanoparticles (FIG. 1A) and lines subject to 15 min copper electroless plating (FIG. 1B). The lines indicate the approximate regions that are shown at higher magnification from both top and cross-sectional perspectives. The arrows in the cross-sectional SEM image of the copper plated lines indicate penetration of copper into the interstitial space of the polydopamine nanoparticle layer.

A single-nozzle inkjet printer was used to print the PDA-NP suspension onto plasma-treated PET substrates (Melinex ST506, Dupont) to form arrays of five lines. After printing and solvent evaporation, PDA-NPs assembled into a pair of continuous lines with a minimal amount of non-continuous deposition within the region between the line pair (FIG. 1A). This phenomenon is caused by a convective flow driven by non-uniform evaporation from the liquid/air interface, and was extensively studied for drops and referred to as the "coffee ring effect" (29). In our previous study, we defined this pair of lines as twin lines due to their similarity (28, 30). The width of a typical as-printed PDA-NP twin line was measured as 3.9±0.6 µm in this study.

A potential mechanism of PDA-induced ELP has been suggested to involve the electrostatic interaction of metallic ions with surface catechol groups of PDA followed by catechol oxidation to quinone and reduction of metallic ions to elemental metal (26). The newly deposited elemental metal further catalyzes the redox reaction for continuous deposition. In this study, Cu ELP was performed by immersing the printed PDA patterns in a chemical bath at 30° C. for different durations.

The morphology of the printed twin line before and after the plating process was characterized by scanning electron microscopy (SEM) (Supra 55VP, Zeiss) from both top and cross-sectional perspectives. For the as-deposited lines, each twin line typically consists of a single-particle thick PDA-NP structure. After 15 min of Cu ELP, a layer of Cu was plated on top of the PDA-NPs with some penetration into the interstitial space of the PDA-NP layer (FIG. 1B). The plated Cu layer exhibited continuous structure with large grain size. It is also worth noting that no line width broadening was observed after Cu ELP.

Figure 2A:
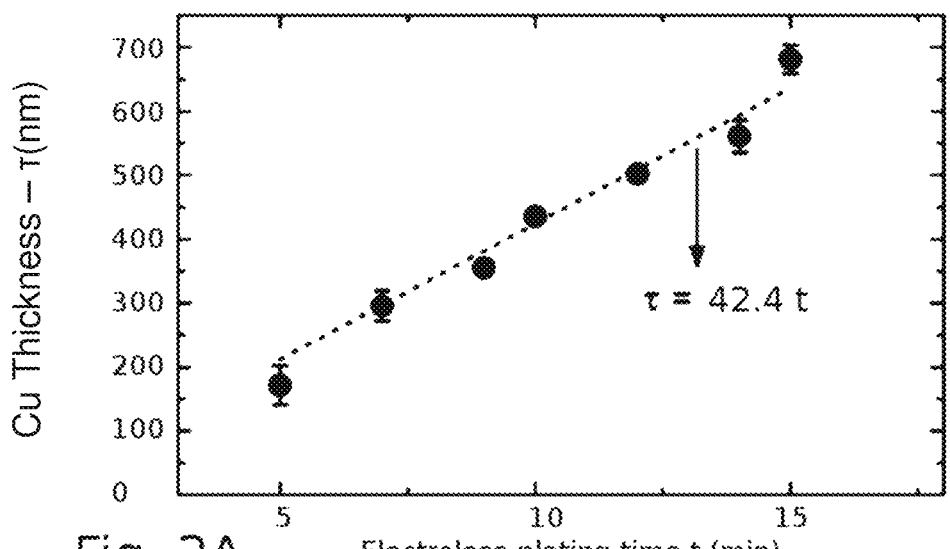
Figure 2B:
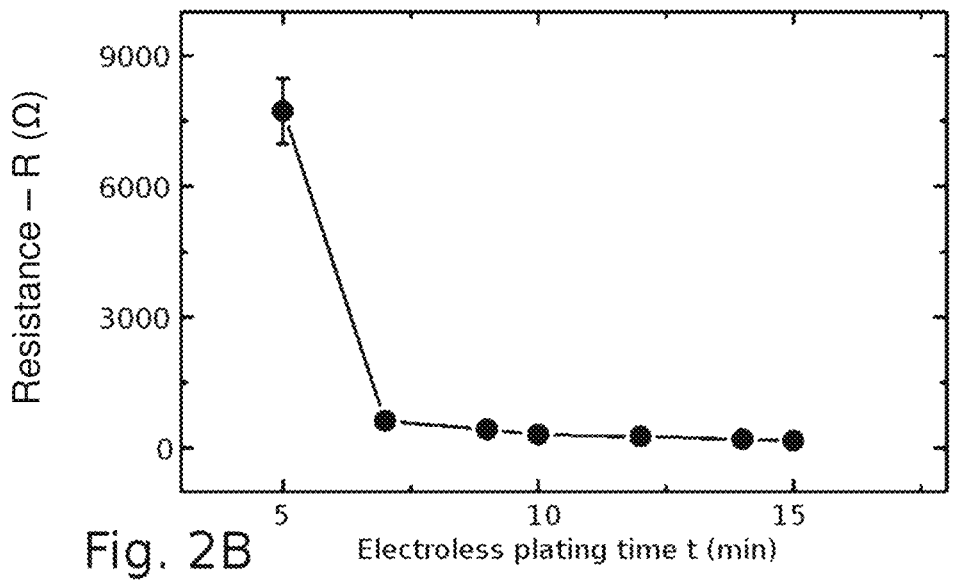
Figure 2C:
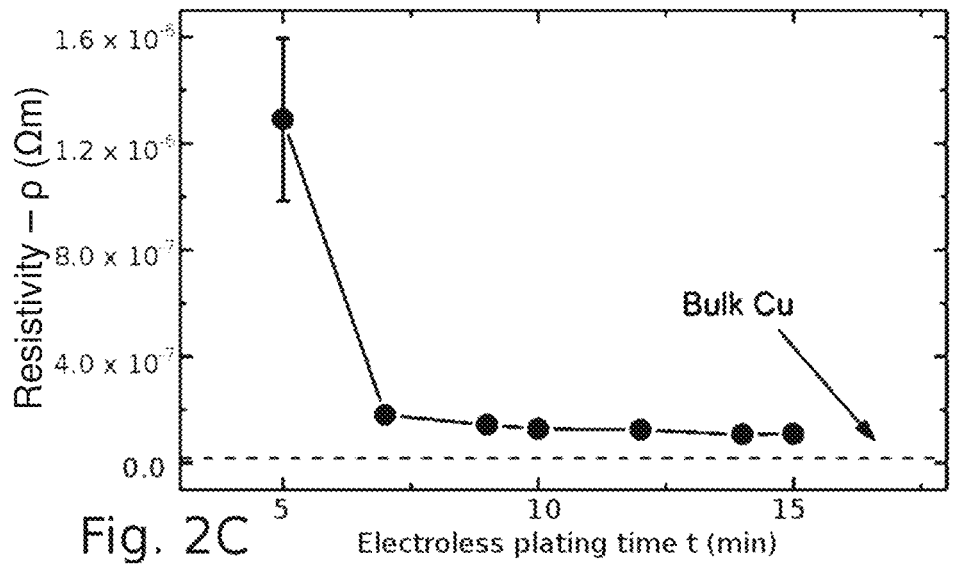

FIGS. 2A-2C show structural and electrical performance characterization of deposit. FIG. 2A shows Cu thickness ($\tau$) evolution. FIG. 2B shows individual twin line resistance. FIG. 2C shows individual twin line resistivity change as a function of Cu electroless plating time (t).

Cu thickness was measured by the analysis of the cross-sectional SEM images. The thickness value is exhibited in FIG. 2A based on the average of at least 8 different cross-sectional SEM pictures at each ELP time. The metal thickness increased linearly with increasing ELP time. The plating rate of the Cu ELP process was measured to be about 42 nm/min. A maximum thickness of 682±23 nm was achieved at the 15 min plating time.

The electrical resistance of each array of plated lines was assessed by a method we previously reported (28, 30). The average resistance of each twin line after ELP processes is shown in FIG. 2B. The minimum time required to achieve a conductive structure was approximately 5 min with a large resistance value of about 7722Ω. The resistance decreased significantly to about 724Ω for an ELP time of 10 min. The resistance then decreased slowly with increased plating time to a final resistance of 165Ω for an ELP time of 15 min. The resistivity of each twin line was calculated according to $\rho = Rw\tau L^{-1}$ where $\rho$ is the resistivity, R the line resistance, w the line width, $\tau$ the thickness, and L the length, respectively. The calculated resistivity values are shown in FIG. 2C. The resistivity values decrease with increasing ELP time and the trend is similar to the resistance change shown in FIG. 2B. The lowest resistivity value achieved after 15 min ELP was $1.1 \times 10^{-7}$ Ωm, a value approximately 6 times that of bulk Cu.

Figure 3:
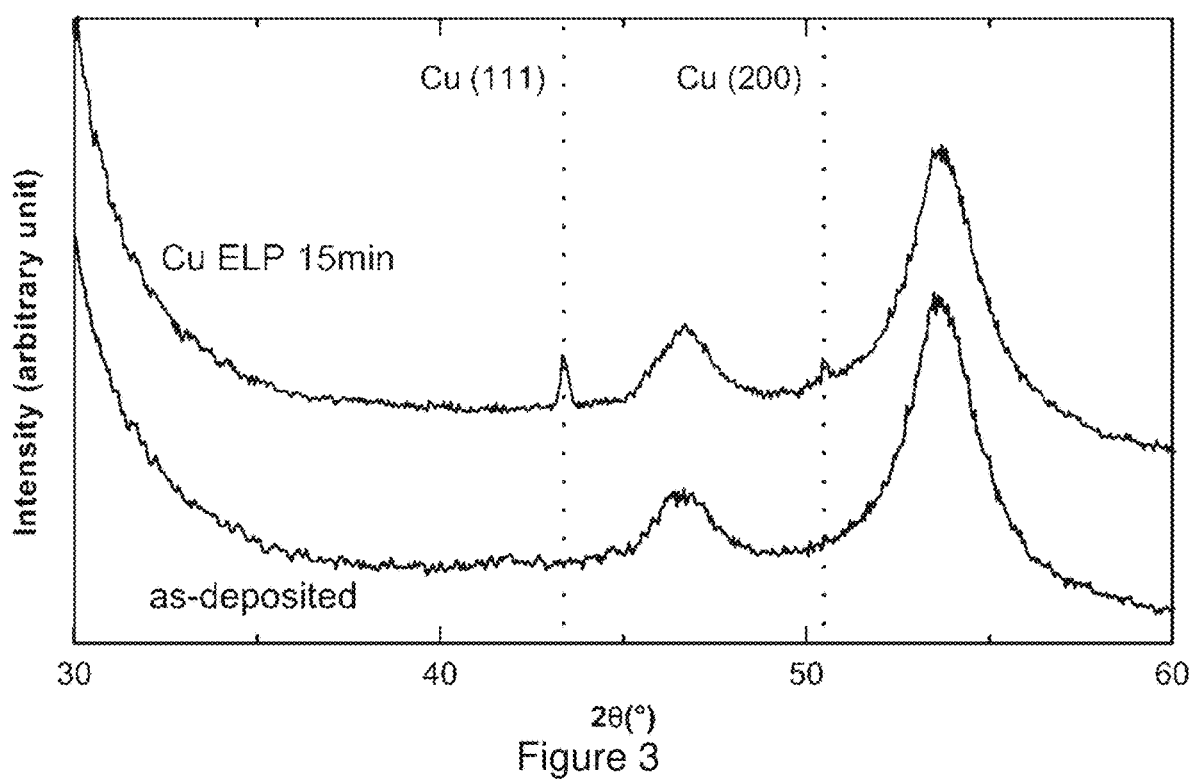
FIG. 3 shows X-ray diffraction results of the printed polydopamine nanoparticle arrays before and after 15 min Cu electroless plating. The dotted lines indicate 2θ values of face-centered-cubic copper according to the Joint Committee on Powder Diffraction Standards (JCPDS) file 04-0836.

FIG. 3 shows X-ray diffraction results of the printed polydopamine nanoparticle arrays before and after 15 min Cu electroless plating. The dotted lines indicate 2θ values of face-centered-cubic copper according to the Joint Committee on Powder Diffraction Standards (JCPDS) file 04-0836.

Materials composition was confirmed by X-ray diffraction (XRD) (XDS2000, Scintag) as shown in FIG. 3. The broad diffraction peaks occurring at 2θ angles of approximately 47 and 54° are attributable to the PET substrates (31). The existence of printed PDA-NP lines does not introduce any additional diffraction patterns. For the patterns after 15 min Cu ELP, two characteristic diffraction peaks were exhibited associated with face-centered-cubic Cu crystalline at 43 and 51° (for Cu (111) and (200) planes, respectively). The 2θ locations of the diffraction peaks are consistent with the Joint Committee on Powder Diffraction Standards (JCPDS) file 04-0836. The XRD characterizations were all conducted within 30 min of the completion of the Cu ELP process. The absence of the diffraction peaks of cuprous or cupric oxide is perhaps due to the small amount of native oxide that is undetectable. Additional oxide characterization was beyond the primary focus of this study.

Figure 4A:
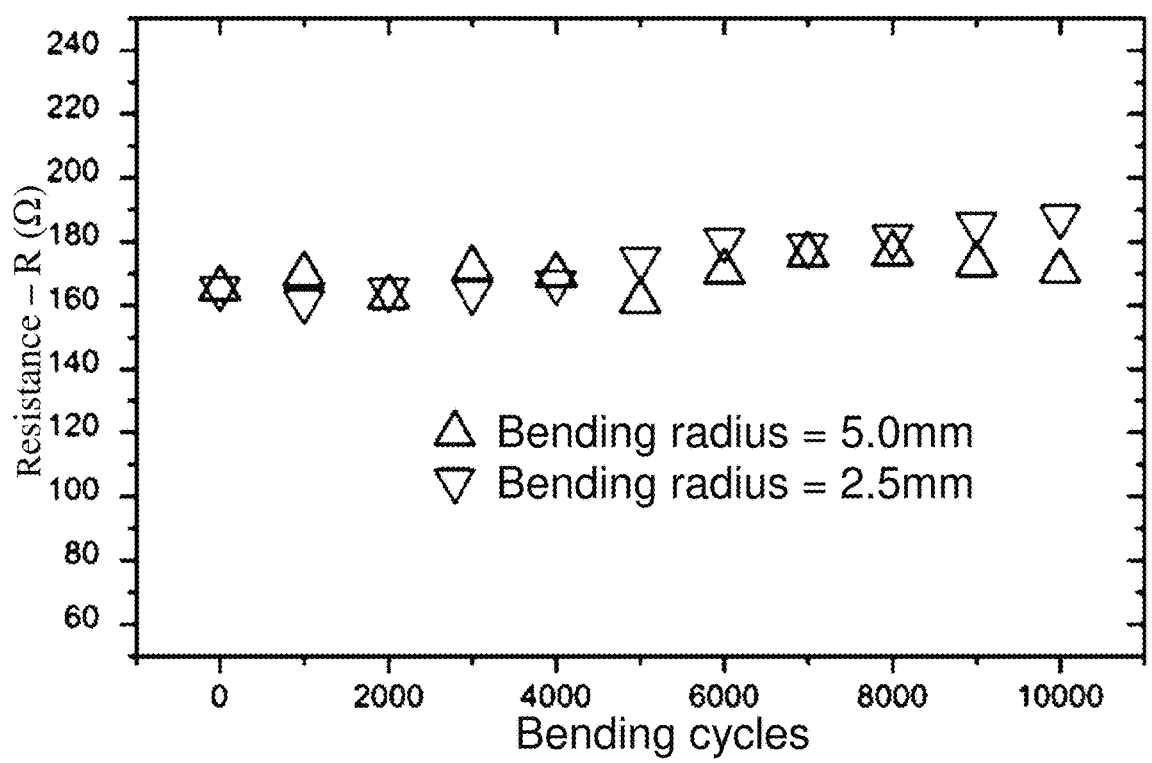
Figure 4B:
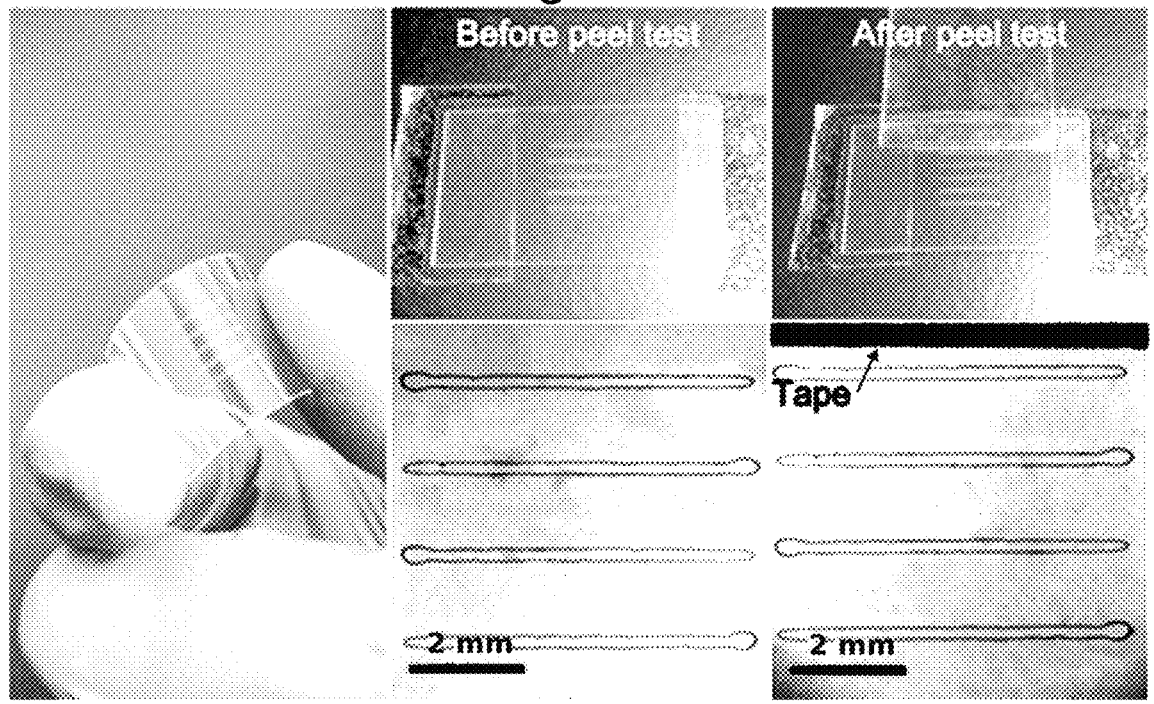
Figure 4C:
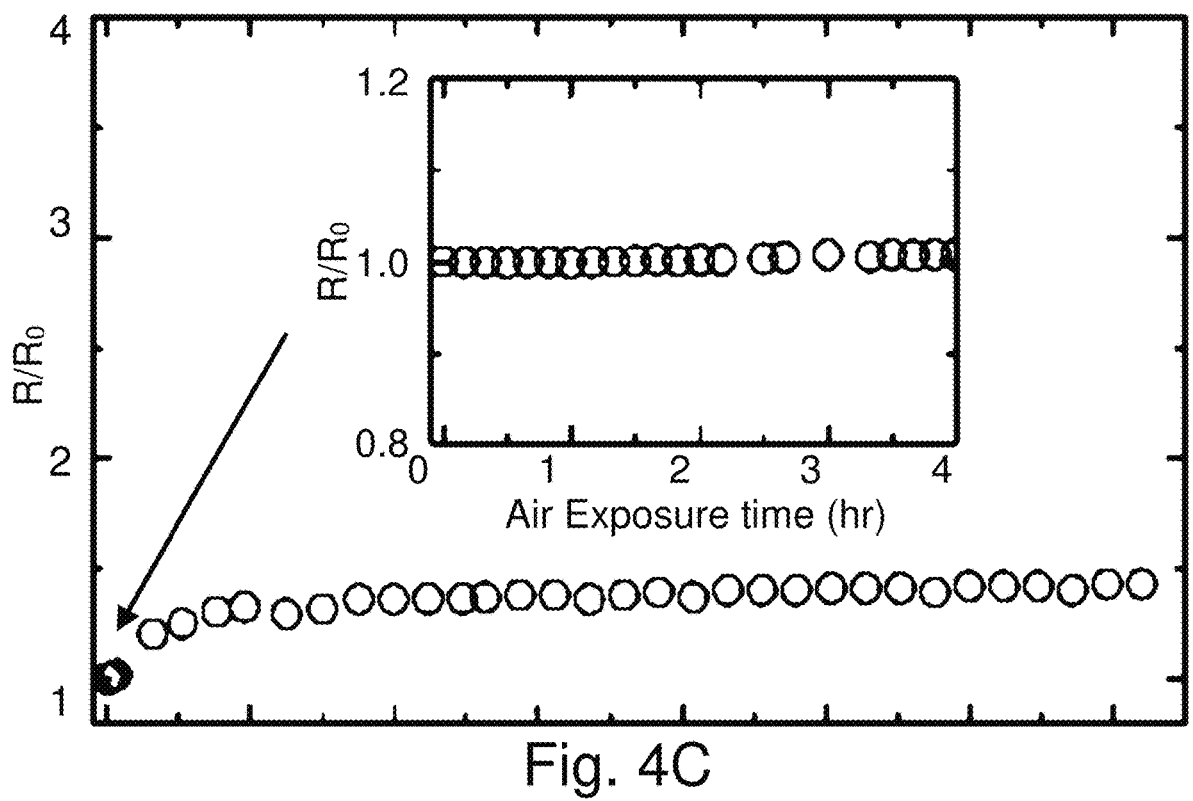
Figure 4D:
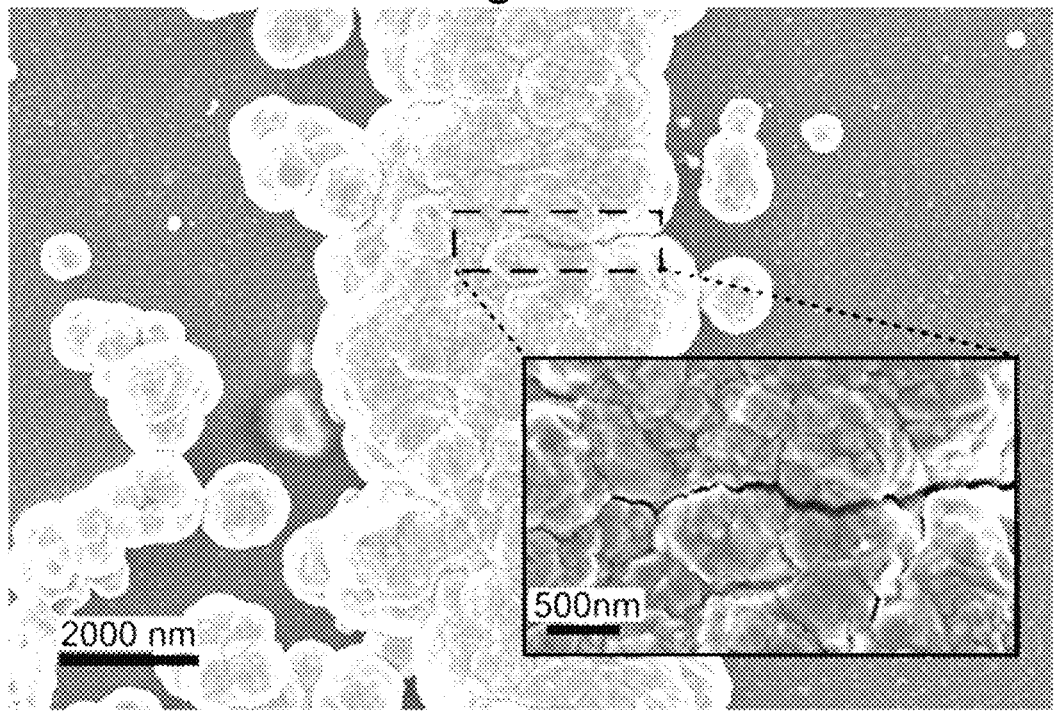

FIGS. 4A-4D provide robustness characterization of the inkjet printed polydopmaine nanoparticle (PDA-NP) lines followed by 15 min Cu electroless plating. FIG. 4A shows Twin line resistance change after cyclic bending. FIG. 4B shows results of a tape peel adhesion test. FIG. 4C shows the influence of air exposure time on plated line resistance (R) relative to its as-plated resistance (RO) (the inset is the first 4 h air exposure result as indicated by the arrow). FIG. 4D shows SEM images revealing the formation of cracks after 10,000 bending cycles with 2.5 mm bending radius per FIG. 4B.

The bending robustness of Cu patterns was assessed using a cyclic bending test. During each cycle, the substrate was cyclically bent between concave and convex geometries with known radius of curvature (2.5 mm or 5 mm). The number of cycles ranged from 1000 to 10000, while the bending frequency was maintained at 100 cycles/min. The resistance of each line versus number of bending cycles is shown in FIG. 4A. All the test samples were plated for 15 min. Only a slight increase of resistance with cycles was observed when the 5 mm bending radius was applied (FIG. 4A). The resistance increases from the as-plated value 165 to 170Ω (about 5% increase). For the 2.5 mm bending radius, the resistance value increased to 187Ω, a 13% increase compared to the value prior to bending. The resistance increase due to bending is likely due to the formation of cracks as shown in FIG. 4A (SEM images).

The adhesion of the plated metal lines was assessed qualitatively by a tape peel test. Briefly, a tape (Scotch600, 3M) was carefully adhered to the patterns and subsequently removed by peeling it off parallel to the substrate. Then the remaining patterns were observed by an optical microscope (AxioObserver Al, Zeiss). The plated lines (15 min Cu ELP) demonstrate good adhesion on PET substrates (FIG. 4B). Subsequent to adhesive tape attachment and removal, no evidence of delamination or structural change was observed. Furthermore, there was no apparent degradation of adhesion after 10000 bending cycles.

FIG. 4C shows resistance as a function of air exposure time in a room environment. The Cu lines were formed by ELP for 15 min. Cu line resistance increases gradually to a value 1.43 times its as-plated value after 720 h, likely due to the formation of Cu oxides when elemental Cu is exposed to air. The resistance within the first 4 h of air exposure shows no increase relative to its as-plated resistance (FIG. 4C, inset), confirming that the Cu line resistance increase shown in the cyclic bending test (FIG. 4A) was not influenced by air exposure, as the bending test and the resulting resistance measurement were completed within 2.5 h.

Figures 7A, 7B, 7C:
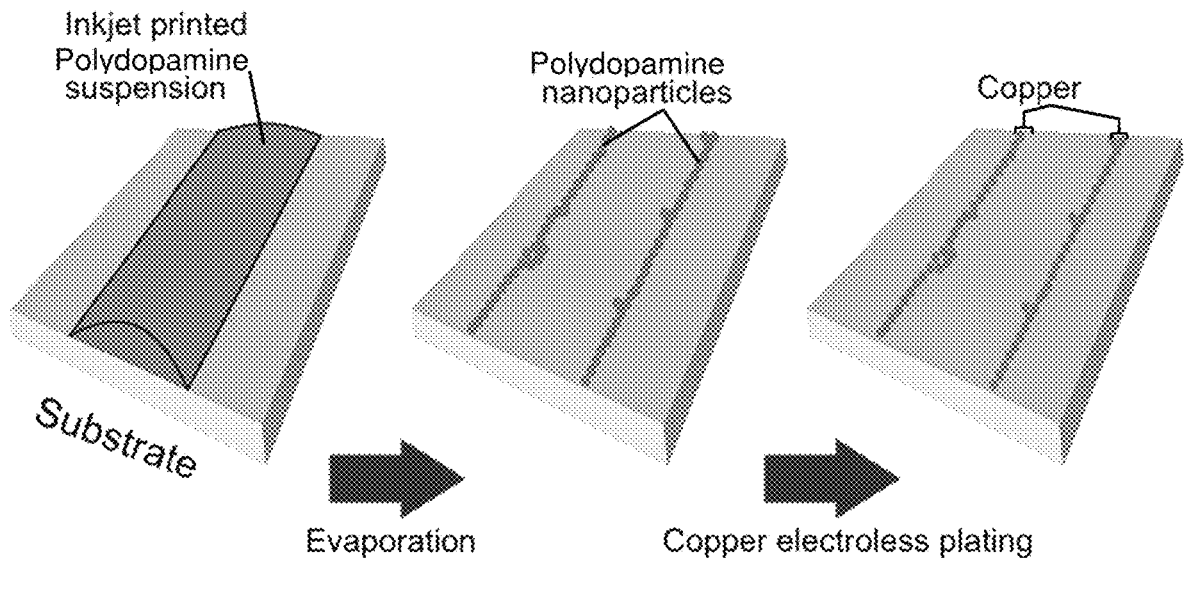
FIGS. 7A-7C shows stages of a process according to the present technology.

FIG. 7 shows stages of a process according to the present technology. On the left, a polydopamine nanoparticle suspension is inkjet printed on a substrate, and forms a domed pattern corresponding to the deposition droplet locations. After the liquid dries, the coffee ring effect causes the nanoparticles to selectively deposit the nanoparticles at the edges of the original liquid range. On the right, the polydopamine nanoparticles are electrolessly plated with copper.

Therefore, fine lines of Cu with low electrical resistivity were fabricated by sequential inkjet printing of an aqueous dispersion of mussel-inspired poly(dopamine) nanoparticles and site-selective electroless plating. The process forms Cu lines with thickness linearly dependent on plating time, and with an electrical resistivity 6 times that of bulk Cu. The resistance of the Cu lines does not change significantly with cyclic bending characterized by a 5 mm bending radius. While resistance of Cu lines is subject to increase over long-time storage, probably because of oxidation, the conductivity observed is reasonably stable for at least one month, giving reasonable time to manufacture a complete system and protect the lines from further degradation. This process demonstrates a simple, low temperature and low-cost method of fabricating fine conductive Cu patterns for flexible electronics applications.

Example 2

Materials

Dopamine hydrochloride (98.5%, Sigma Aldrich), Tris (99.9%, Sigma Aldrich), 2-propanol (99.5%, Fisher Scientific), silver nitrate (99%, Sigma Aldrich), ethylenediamine (98% m Fisher Scientific), potassium sodium tartrate tetrahydrate (99%, Fisher Scientific), 3,5-diiodotyrosine (99%, Sigma Aldrich), copper chloride dehydrate (99%, Fisher Scientific), ethylenediamine (99%, Fisher Scientific), ascorbic acid (99%, Fisher Scientific), potassium bromide (99%, Fisher Scientific), cobalt chloride hexahydrate (98%, Fisher Scientific), 2,2'-Bipyridal (98%, Fisher Scientific), hydrochloric acid aqueous solution (1M, Sigma Aldrich) and sodium hydroxide (99%, Fisher Scientific) were used as received. Water was distilled subsequent to deionization (DI) prior to use.

Polydopamine Nanoparticle (PDA-NP) Synthesis

PDA-NP powder was synthesized according to a published protocol (27) with minor modification. Tris was dissolved in distilled DI water at 10 mM to form 250 ml solution to which 2-propanol was subsequently added. Magnetic stirring was applied at 300 rpm for 30 min to ensure a uniform mixture. 125 mg dopamine chloride was added to this mixture, and keeps being stirred at the same condition for 72 hrs to form the PDA-NP suspension. Purification was necessary to remove excessive reactant and Tris. This was achieved by eight cycles of 10,000 rpm centrifugation (5810R, Eppendorf) for 10 min at 23° C., decantation of upper liquid and re-dispersion of settled solid in fresh distilled DI water by vigorous shaking. The synthesized PDA-NP was dried under a mild nitrogen stream overnight.

PDA-NP Diameter Characterization

Figure 5:
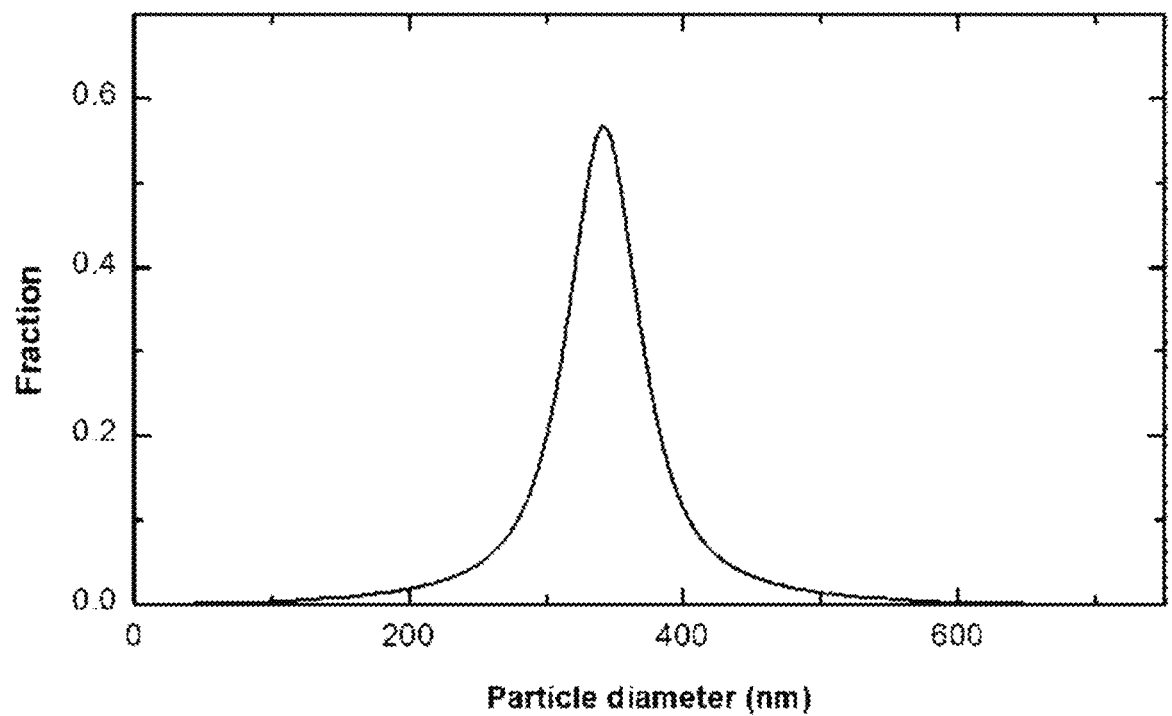
FIG. 5 shows a typical dynamic light scattering (DLS) particle size analysis result according to the embodiment described in Example 2.

The PDA-NP diameter was characterized by dynamic light scattering (DLS). The result is shown in FIG. 5.

Substrate Preparation

PET (Melinex ST 506, Dupont) substrates thoroughly rinsed by copious water and 2-proponal alternatively. The substrate surfaces were processed by oxygen plasma to improve hydrophilicity using a plasma treatment system (PE200-RIE, PlasmaEtch). Before plasma generation, the chamber was vacuumed to less than 5 mtorr. Then ultra-high pure oxygen was introduced to the chamber at flow rate of 20 sccm while maintaining the final pressure at 100 mtorr. After the flow rate and pressure were stabilized for 10 min, oxygen plasma was generated at 100 W radio frequency (13.56 Hz) power for 1 min. The auto-tuning network was used to ensure the maximum reflected power less than 1 W along the entire plasma duration. The substrates were used immediately after plasma processing.

Drop-On-Demand (DOD) Inkjet Printing Process

The DOD inkjet printing system used in this study is a custom-designed apparatus with a single piezoelectric printing nozzle of 80 μm orifice diameter (Microfab). The nozzle is actuated by a waveform generator (JetDrive III, Microfab) and positioned by a computer-controlled x-y stage (MX80L, Parker). Drop formation was observed along an optical axis perpendicular to the nozzle with a camera (Sensicam QE, Cooke Corp.) to maintain drop diameter (55±2 μm), speed (1±0.2 m/s), and ensure absence of satellites. Drop frequency was controlled at 100 Hz by adjusting the frequency of the waveform generator. The centre-to-centre distance between two adjacent printed droplets was fixed at 50±2 μm and controlled by the speed of the inkjet nozzle over the substrate (5 mm/s). The printed line length was controlled at 6 mm. Five lines were printed to form an array. And four arrays were on each substrate.

Electroless Plating (ELP) Process

Distilled DI water used for Cu ELP process was deoxygenated by bubbling nitrogen gas over 24 hrs. The Cu ELP bath comprises aqueous solutions of 50 mM copper chloride dehydrate, 600 mM ethylenediamine, 150 mM cobalt chloride hexahydrate, 0.04 mM potassium bromide and 0.04 mM 2,2'-Bipyridal. The PH value of the as-prepared bath was adjusted to 9.4±0.1 by adding appropriate amounts of sodium hydroxide and hydrochloric acid solutions. During plating, the bath PH was maintained within the range 9.4 and 9.5 by adding hydrochloric acid at 0.2 ml/min with a syringe pump. The ELP solution temperature was controlled at 30° C. using a water bath. The solutions were mechanical stirred at 100 rpm during the entire plating period.

Electrical Resistance Characterization

Figure 6:
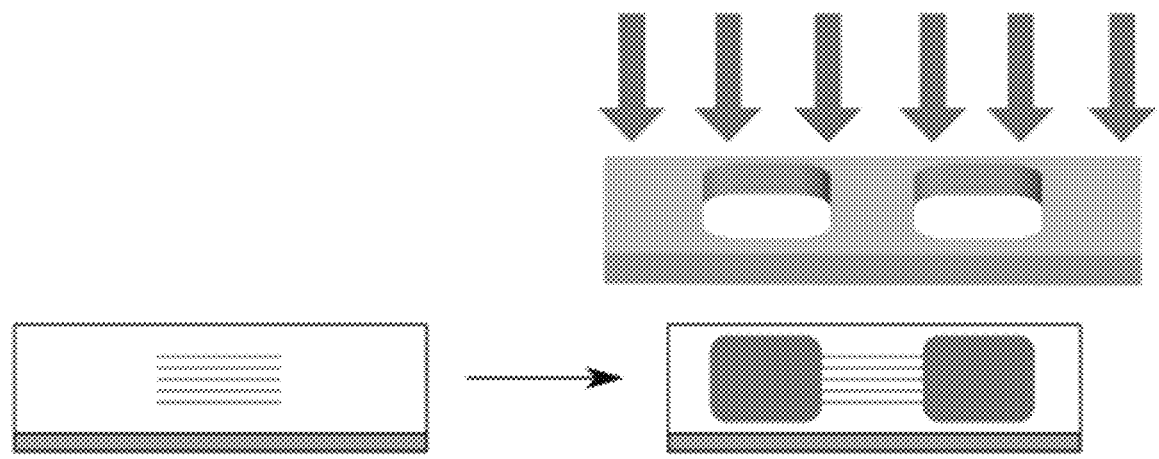
FIG. 6 shows schematic of the mask used for electrode sputtering deposition.

The resistance of each array of printed and plated silver lines was facilitated by depositing two silver electrodes at the ends of the array such that the printed lines spanned a fixed distance (4 mm) between the electrodes. One electrode pair was deposited over each line array by shadow sputtering silver through machined aluminium mask (FIG. 6). Kapton tape was used to provide ~40 μm standoff distance between the mask and the printed structure. Alignment of the mask to an array was realized with the help of an optical microscope.

The sputter deposition process was carried out with a magnetron sputtering system (CRC-600, Torr International) in DC mode. The deposition was controlled at 50 W with a flow rate of 100 sccm Argon resulting in $1.5 \times 10^{-2}$ torr working chamber pressure. Electrodes of ~200 nm thickness were deposited after 3 min sputtering.

The typical surface temperature of a deposited silver electrode was measured as 29° C. by a thermocouple immediately after the chamber was vented with nitrogen gas to atmospheric pressure (~4 min venting process). It is unlikely that the actual surface temperature during sputter deposition was significantly higher than the measured value so as to have a measurable effect on the structure and electrical performance properties of the printed and plated silver lines.

After electrodes deposition, a four-point-probe method was used to measure the resistance value. Each twin line resistance value can be calculated by sequentially cut a twin and recording the updated resistance value using a parallel resistor model.

Example 3

Polydopamine nanoparticles (PDA-NP) were synthesized according to Yan et al. (27). PDA-NPs were generated by initiating dopamine self-polymerization in a water-isopropanol mixture which was buffered by Tris. The average size of PDA-NP was measured with a dynamic light scattering (DLS) system (zetasizer-nano, Malvern) to be 338±55 nm. The as-synthesized PDA-NP powder was dispersed in distilled deionized (DI) water at 1% wt by 10 min agitation by ultra-sonication. The viscosity and surface tension of the PDA-NP ink were measured as 1.0±0.1 mPas and 72.3±0.1 mN/m using a cone-plate rheometer (AR1000, Texas Instrument) and bubble pressure tensiometer (BP100, Kruss), respectively pH buffer agent Tris was dissolved in distilled deionized (DI) water at 10 mM to form 250 mL solution to which 80 mL of 2-propanol was subsequently added. 125 mg dopamine chloride was added to this mixture, and agitated by magnetic stirring at 300 rpm for 72 hrs to form the PDA-NP suspension. Purification of the suspension was necessary to remove excess reactants and Tris buffer. This was accomplished by three cycles of centrifugation (3500 rpm for 1 hr at 23° C.) and re-dispersion of settled particulate matter in distilled DI water via vigorous shaking. The synthesized PDA-NP was dried under a stream of nitrogen. The ink was prepared by mixing the PDA-NP dry powder with distilled DI water followed by 10 min ultrasonication. All chemicals were purchased from Sigma Aldrich (USA) and used as received.

Figure 8:
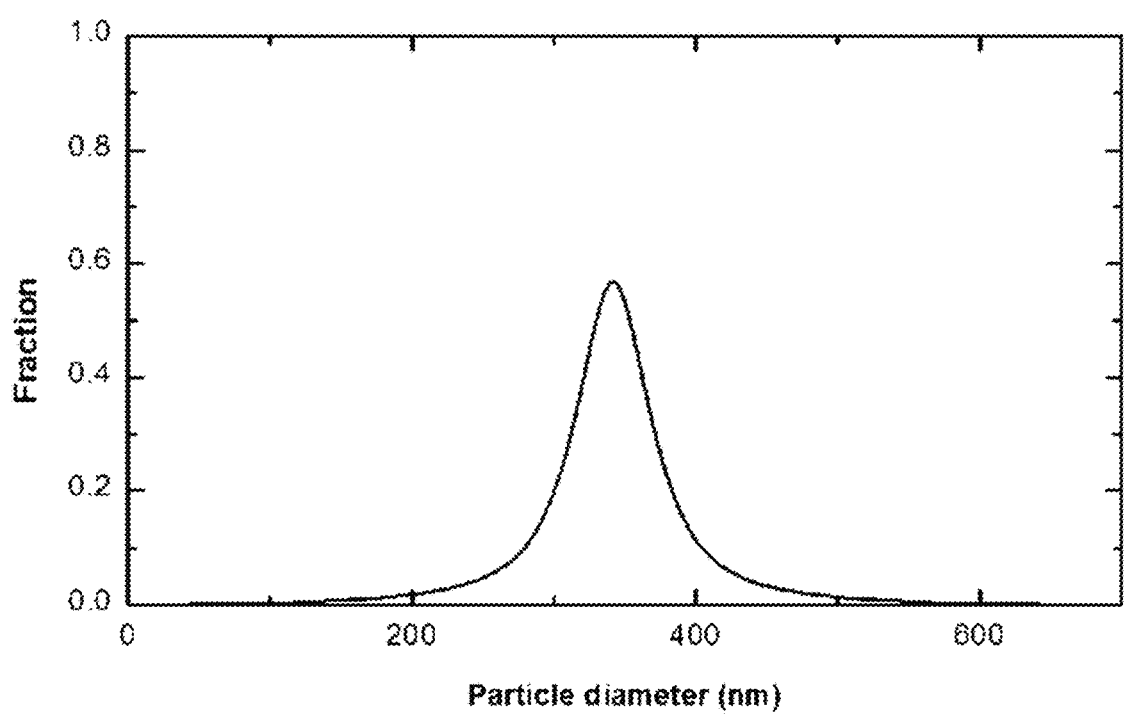
FIG. 8 shows dynamic light scattering characterization of the size distribution of synthesized polydopamine nanoparticles according to the embodiment described in Example 3.

The size distribution of PDA-NP was characterized by dynamic light scattering (Zetasizer-nano, Malvern). A representative size distribution of a 1% wt sample of ink is shown in FIG. 8.

Glass microscope slides (2947, Corning) were used as substrates and were prepared as follows. All substrates were immersed in a Micro-90 (Cole-Palmer) aqueous solution (~1% v) and underwent ultrasonic agitation for 12 min. Copious rinsing with distilled DI was followed by drying under a nitrogen stream. The substrate surface was then processed using argon gas plasma treatment (PE200-RIE, PlasmaEtch) to increase surface hydrophilicity. The plasma parameters were controlled at 100 mtorr pressure and 100 sccm flow rate argon with 100 W radio frequency (13.56 Hz) power for 3 min. The substrates were used immediately after plasma treatment.

The inkjet printing apparatus (30) consists of a single piezoelectric inkjet nozzle (80 µm diameter, Microfab) actuated by a waveform generator (JetDrive III, Microfab) and positioned via a computer-controlled x-y stage (MX80L, Parker). Drop formation was observed along an optical axis perpendicular to the nozzle with a video microscope (Sensicam QE, Cooke Corp.) to maintain drop diameter (55±2 µm), speed (1±0.2 m/s), and ensure absence of satellites. Drop frequency was controlled at 100 Hz by adjusting the frequency of the waveform generator. The center-to-center spacing between two adjacent printed drops was fixed at 50±2 µm and controlled by the traverse speed of the inkjet nozzle over the substrate (5 mm/s). To visualize materials deposition process along with evaporation, a top-view camera (Kodak ES 1.0) and a bottom-view microscope (AxioObserver Al, Zeiss) were equipped.

The electroless plating process followed a published report (11). An aqueous bath consisted of 3.0 mM silver nitrate, 18 mM ethylenediamine, 35 mM potassium sodium tartarate and 0.04 mM 3,5-diiodotyrosine. The bath temperature was maintained at 30° C. Agitation was applied at 100 rpm with mechanical stirring during the entire plating process.

Figure 9A:
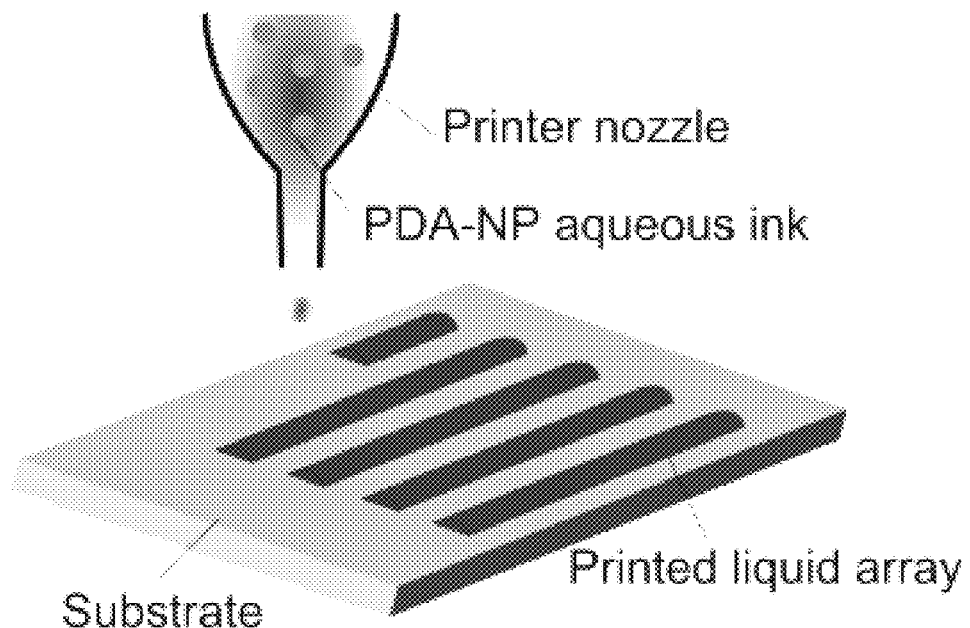
Figure 9B:
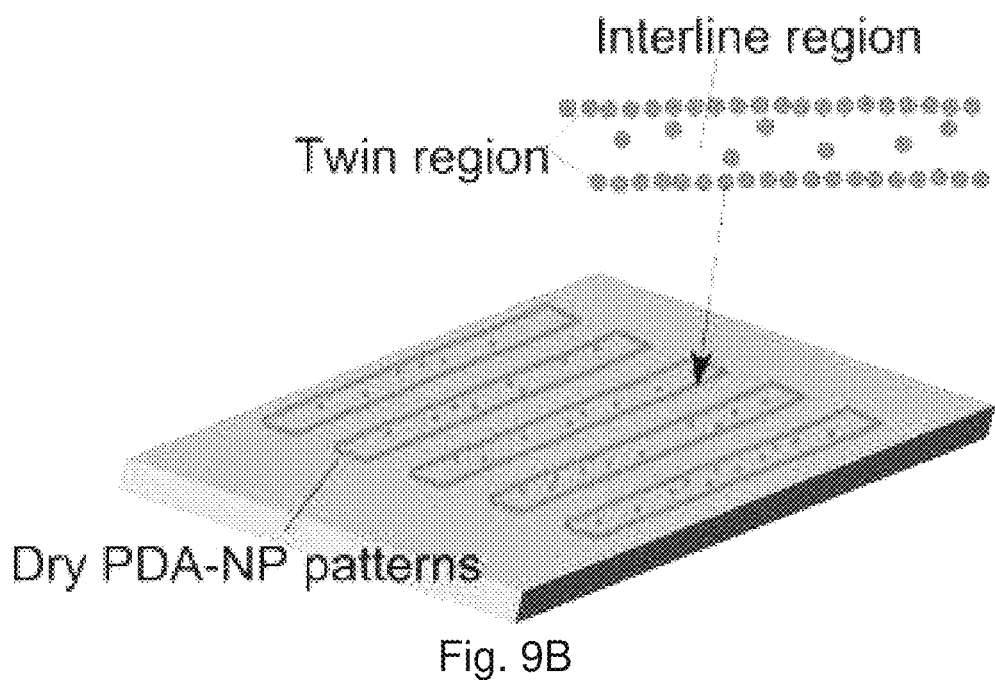
Figure 9C:
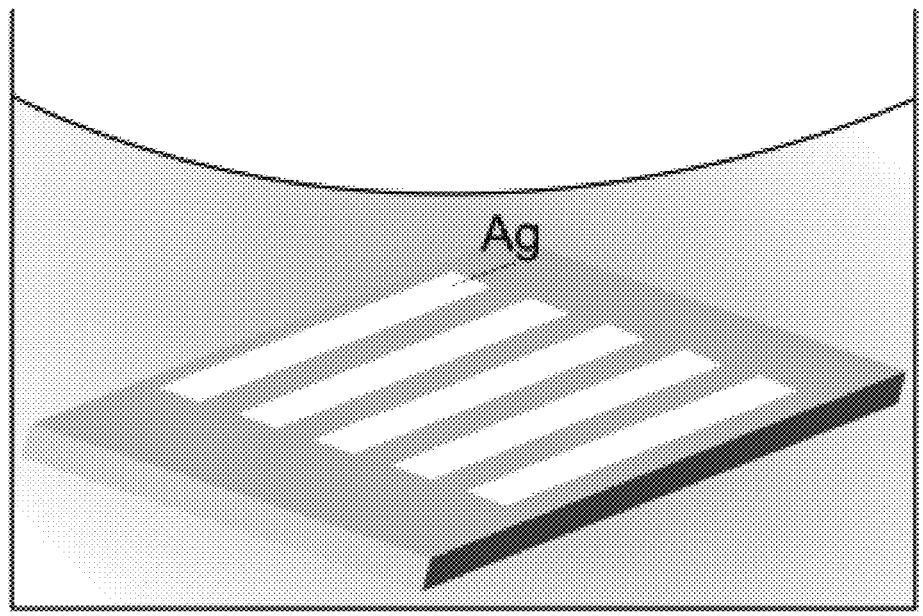
Figure 9D:
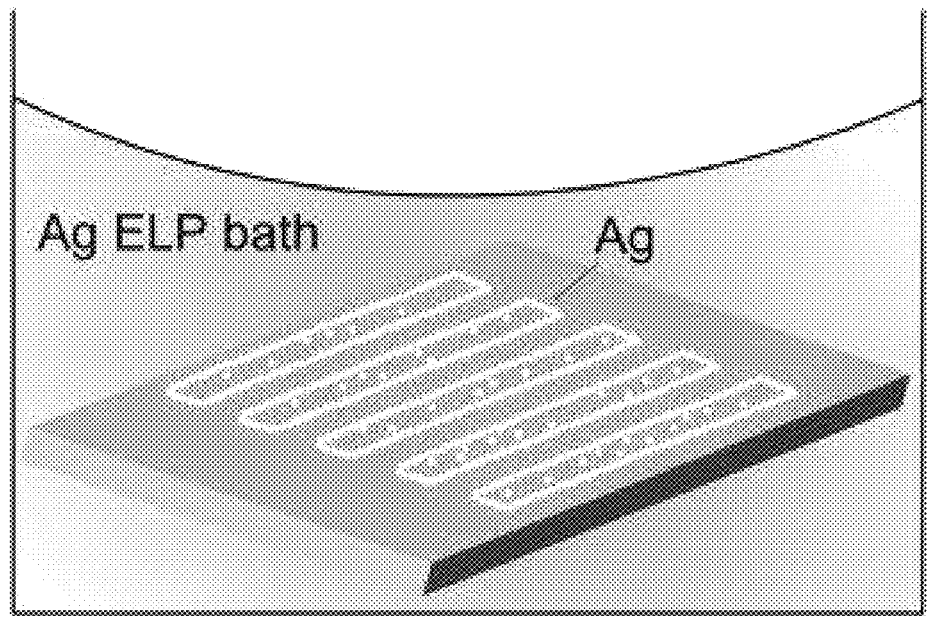

FIGS. 9A-9D show a scheme for producing silver conductive traces on a substrate. FIG. 9A shows poly(dopamine) nanoparticles (PDA-NP) prepared as aqueous ink and inkjet printed on a glass substrate. FIG. 9B shows pattern of PDA-NP was formed after evaporation. FIGS. 9C and 9DD show Ag electroless plating for short and long time, respectively.

A single-nozzle inkjet printer was used to print the PDA-NP suspension onto plasma-processed glass substrates (2947, Corning) to form arrays of five lines, as shown in FIGS. 9A-9B. Solvent evaporation during printing deposits nanoparticles at the contact line of the printed fluid structure which results in a pair of twin parallel lines with minimal particle deposition in the interline region. Each twin line measured 24±1 µm in width with 400±12 µm between each pair. This twin-line deposition process is a form of the well-known evaporatively-driven "coffee ring" phenomenon (29). In a previous report, we demonstrated the utilization of this phenomenon to print highly conductive twin lines and rectilinear grids of silver nanoparticles (30).

Ag deposition onto the printed pattern can be achieved by simple immersion into a silver salt solution such as silver nitrate ($AgNO_3$) (26). However, an ELP process that includes an additional reducing agent is necessary to ensure the rapid formation of a continuous and sufficiently thick metal layer. A potential mechanism of PDA-induced ELP has been suggested to involve the electrostatic interaction of metallic ions with surface catechol groups of PDA followed by catechol oxidation to quinone and reduction of metallic ions to elemental metal. The newly deposited elemental metal further catalyzes the redox reaction for continuous deposition. In this study, Ag ELP was performed by immersing the printed PDA patterns in a chemical bath at 30° C. for different durations.

Figure 10A:
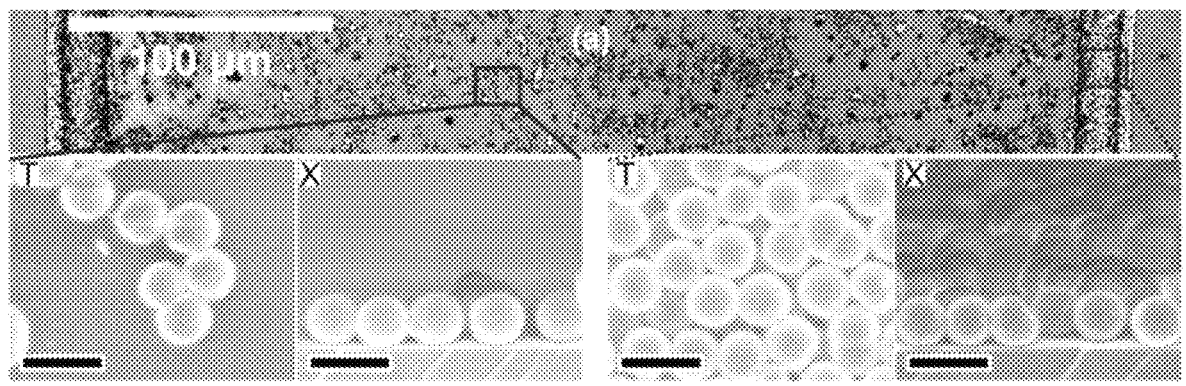
FIGS. 10A-10C show typical microscopic images of inkjet printed polydopamine nanoparticle (PDA-NP) lines as a function of silver electroless plating (Ag ELP) time, showing top-view optical images of as-deposited PDA-NP lines, after 24 min (FIG. 10A) and 120 min (FIGS. 10B, 10C) Ag ELP, respectively; the exploded views show top and cross-section SEM images at the indicated regions. The SEM scale bars are 500 nm. The SEM labels T and X refer to top and cross-sectional view, respectively.
Figure 10B:
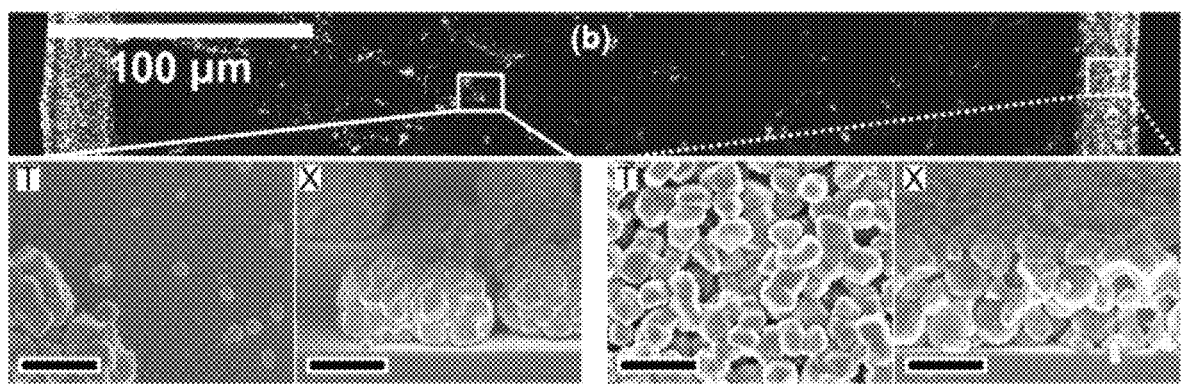
Figure 10C:
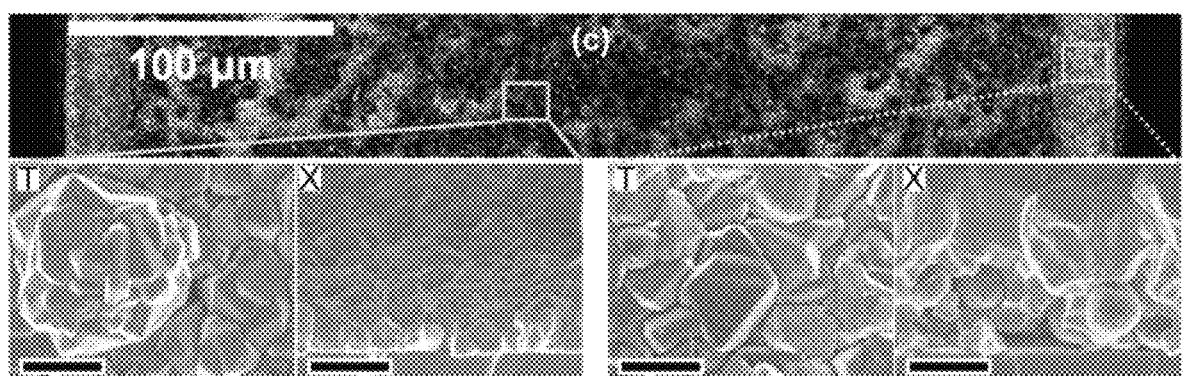

The morphology of the printed lines before and after the plating process was characterized by optical microscopy (Axio Imager, Zeiss) and scanning electron microscopy (SEM) (Supra 55VP, Zeiss). Top and cross-sectional views show that for the as-deposited lines, each set of twin lines consists of closely-packed PDA-NP structure that is 1-2 particles thick (FIG. 10A). In contrast, the interline region of each twin line pair consists of few PDA-NP islands. After 24 min Ag ELP, a porous and small-grain Ag layer forms on top of each twin line. In the interline region, Ag deposition occurred predominantly over the PDA-NP islands with minimal nucleation of Ag directly on the substrate (FIG. 10B, top-view SEM at the interline region). The Ag continuity and grain size increase with extended ELP time (FIG. 10C) at both twin and interline regions. However, smaller grain size and less continuous structures were always observed for the Ag grown in the PDA-NP-free region. SEM cross-sectional images show that, in general, ELP yields a thin layer of Ag over the top surface of the PDA-NP deposit; some penetration into the space between PDA-NPs can also be observed (FIGS. 10B and 10C), cross-sectional view SEM at the twin region).

Figure 11A:
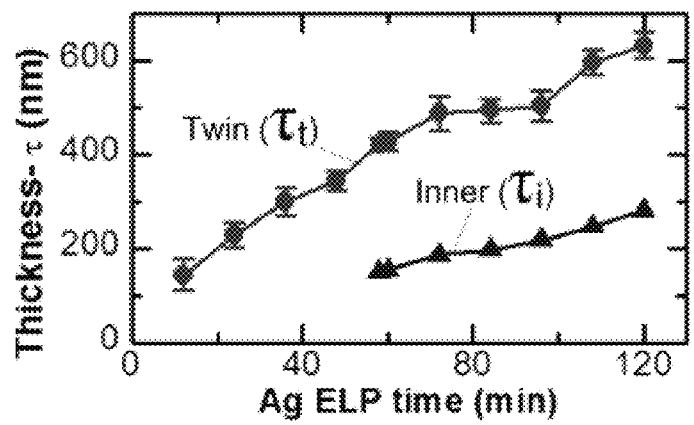

Cross-sectional SEM images were also analyzed to measure the Ag thickness on each twin line and interline region as a function of metal plating time. Plating times shorter than 1 hr did not yield accurate thickness measurements of the interline region due to its discontinuity. In general, the Ag growth rate at the twin lines is linear and larger in comparison to that of the interline region (FIG. 11A).

Figure 11B:
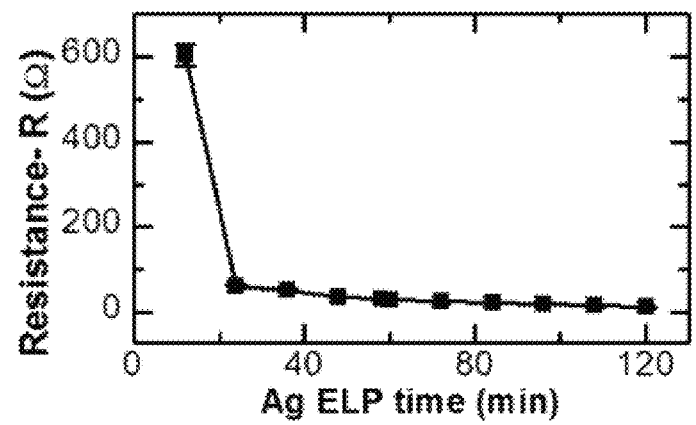

The electrical resistance of Ag-plated lines was measured using a line scratching technique (74, 75). Briefly, a pair of Ag electrodes was sputtered through a mask over each line array so that the lines spanned the distance between electrodes. Four-point-probe measurements were carried out to determine the total resistance of the five lines. Each line was carefully cut by a needle attached to a micro-positioner and the new resistance value recorded. Under the assumption that each line array is a parallel resistor network, this method allowed measuring the average resistance of each cut line. As FIG. 11B shows, single line resistance decreases rapidly within 24 min (62.20Ω) of ELP, followed by slower decay on a longer time scale to reach the lowest value of 11.70Ω at 120 min. It was possible to determine whether the interline region of each twin line pair was conductive by cutting all the twin lines. It was found that for plating times longer than 58 min, an electrically conductive path forms in the interline region.

For electroless plating time $t_{plating} < 58$ min, only the pair of twin lines is conductive. The measured resistance ($R_m$) is expressed as:

$$\frac{1}{R_m} = \frac{2}{R_t} = \frac{2}{\rho_t L / (W_t \tau_t)} \quad (1)$$

$$\rho_t = \frac{2 R_m W_t \tau_t}{L} \text{ for } t_{plating} < 58 \text{ min} \quad (2)$$

For $t_{plating} \geq 58$ min, both twin lines and the interline region are conductive so that the measured resistance is:

$$\frac{1}{R_m} = \frac{2}{R_t} + \frac{1}{R_i} = \frac{2}{\rho_t L / (W_t \tau_t)} + \frac{1}{\rho_i L / (W_i \tau_i)} \quad (3)$$

where $\rho_i$, $W_i$ and $\tau_i$ are the interline region's resistivity, width and thickness, respectively.

The procedure used to measure $\rho_i$ independent of $\rho_t$ is demonstrated as follows. First, the combined resistance $R_m$ was measured, then the twin lines were mechanically sequentially scratched off and the new resistance $R^*_m$ recorded. With the measured width of interline region ($W^*_i$) and its resistance ($R^*_m$), the resistivity of the interline region is:

$$\rho_i = \frac{R^*_m W^*_i \tau_i}{L} \quad (4)$$

Substituting Eq. 4 into Eq. 3, $\rho_t$ can be written as:

$$\rho_t = \frac{2 R_m W_t \tau_t}{\rho_i L - W_i R_m \tau_i} \text{ for } t_{plating} \geq 58 \text{ min} \quad (5)$$

The term W may be replaced by $W - 2W_t$ where W is the width of the entire line.

Figure 11C:
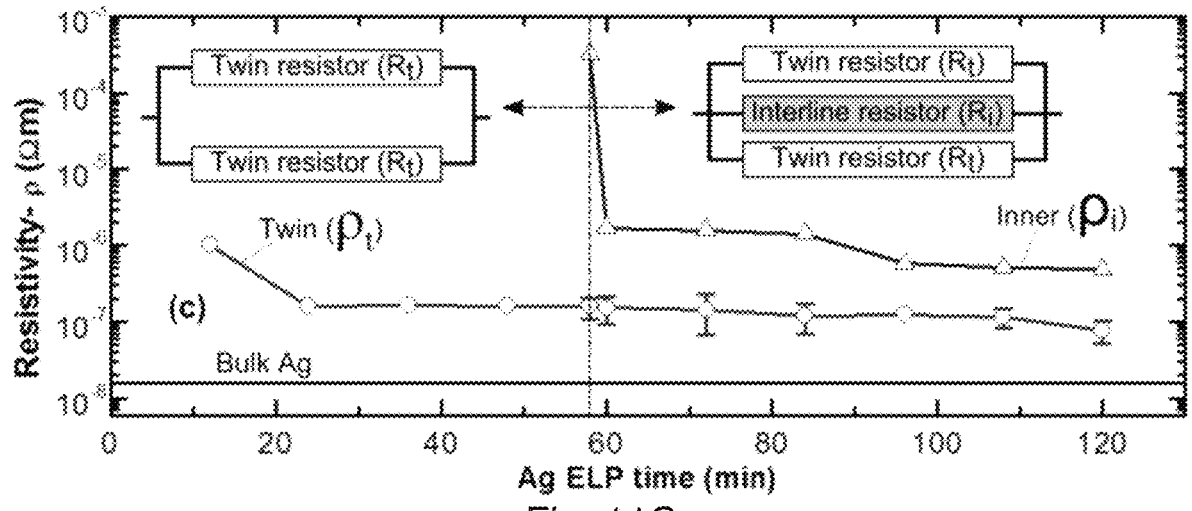

The electrical resistivity of plated lines of silver was estimated based on two observed structural regimes: i) for plating times shorter than 58 min, a twin-line structure consisting of two parallel conductors with no electrical contribution from the interline region and ii) a three parallel-conductor model for t≥58 min (FIG. 11C inset). For the two-conductor structure, the resistivity ($\rho_t$) can be expressed as $\rho_t = 2R\tau_t W_t/L$ (where R the measured resistance of an individual line (a pair of twin lines), $\tau_t$ the Ag thickness at the edge, $W_t$ the width of twin and L the length between two electrodes). For the three-conductor case, the electrical resistance of the interline region was measured by complete removal of the twin lines. The resistivity of each twin line can then be expressed as $$\rho_t = 2R\tau_t W_t / L \rho_i = 2R\tau_t W_t \rho_i / \rho_i L - (W - 2W_t) R \tau_i ),$$

where $\rho_i$ is the resistivity of the interline region; R the measured resistance of an individual line (a pair of twin lines plus the interline region); W the entire line width and $\tau_i$ the Ag thickness at the interline area). FIG. 11C plots $\rho_t$ and $\rho_i$ values as a function of ELP time. Within the first 24 minutes of plating, $\rho_t$ reaches a value which is 10× larger than the resistivity of bulk Ag. The first measurable $\rho_i$ occurs at 58 min indicating the onset of structural continuity of the interline region. The large resistivity (3.12E-4 Ωm) at that moment can be explained by film's highly porous nature as also confirmed by SEM images. The values of $\rho_i$ decreased more than two orders within only two minutes from 58 to 60 min. After longer plating time, $\rho_i$ decreases slowly. The lowest values for $\rho_i$ and $\rho_t$ are $4.84 \times 10^{-7}$ and $7.80 \times 10^{-8}$ Ωm which are 30× and 5× comparing with the bulk Ag resistivity value, respectively.

Figure 12:
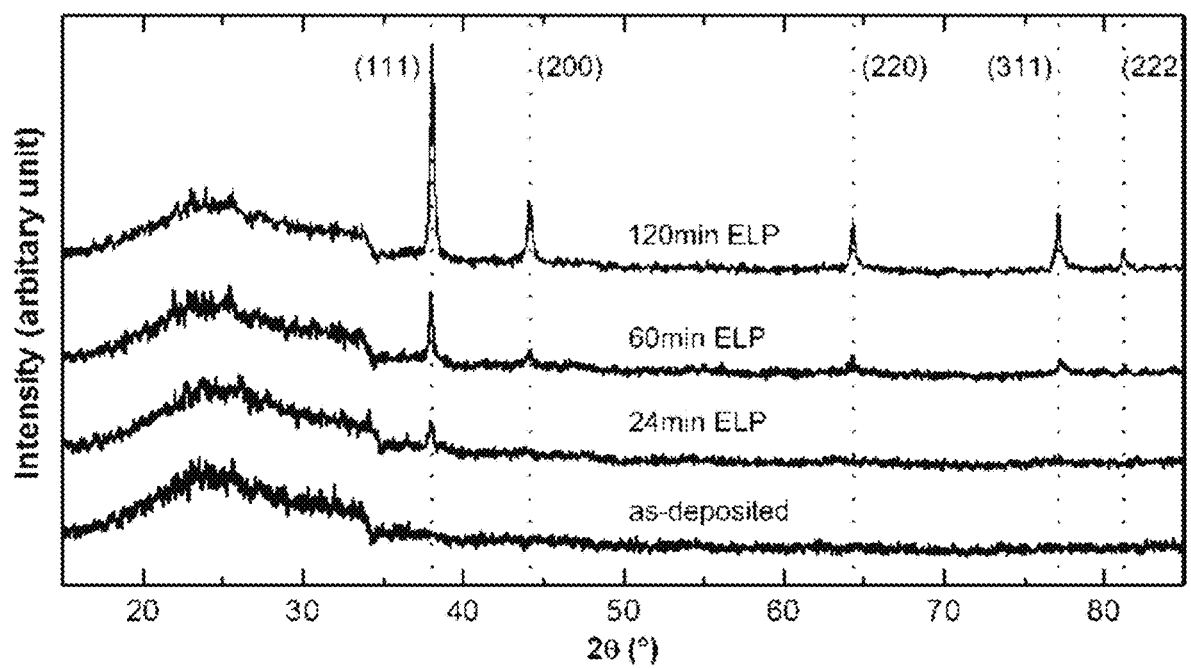
FIG. 12 shows XRD patterns of the inkjet printed PDA-NP arrays as a function of Ag ELP time: The dotted lines indicate 2θ values of face-centered-cubic Ag according to the Joint Committee on Powder Diffraction Standards (JCPDS) file 04-0783

Crystallographic analysis of the deposited Ag was performed by X-ray Diffraction (XRD) (Equinox 2000, Inel) on each array. Diffraction patterns after different plating times are displayed for in FIG. 12. A large diffraction peak around 25° indicates the contribution of the amorphous glass substrate. As-deposited PDA patterns did not display any characteristic diffraction peaks. The appearance of a strong peak at 38.1° after 24 min plating indicates Ag (111) crystal planes. After 60 min, the peak intensity at 38.1° increases and four additional peaks appear at about 44.1°, 64.4°, 77.3° and 81.4°, corresponding to Ag crystal planes of (200), (220), (311) and (222), respectively. The intensity of all 5 peaks continues to grow with longer plating. The emergence of characteristic Ag peaks and their increase in intensity is consistent with Ag growth observed from SEM. The diffraction peaks' narrowing effect is also observed comparing the patterns collected at 120 min with 60 min ELP time. It can be explained by Ag crystalline improvement along with increasing ELP time which is again, implied by the Ag continuity increase from SEM images. Here, we did not apply the Scherrer's equation (76) to estimate the crystallite size due to the nature of discontinuous pattern, which influences the estimation accuracy.

In conclusion, Ag lines of high electrical conductivity were fabricated by sequential inkjet printing of mussel-inspired poly(dopamine) nanoparticle ink and Ag electroless plating. The process yields silver lines with thickness linearly dependant on plating time and electrical conductivity of 5× that of bulk silver. The conductive path could be adjusted between the twin lines and entire structures by controlling the ELP time, which opens an opportunity for resolution control of printed conductive structures. This process demonstrates a simple, low-temperature and low-cost method of fabricating conductive paths for flexible electronics applications.

There has thus been shown and described novel communications devices and systems and methods which fulfil various objects and advantages sought therefor. Many changes, modifications, variations, combinations, subcombinations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

REFERENCES

Each of the following references is expressly incorporated herein by reference in their entirety.
(1) Angmo, D.; Larsen-Olsen, T. T.; Jørgensen, M.; Søndergaard, R. R.; Krebs, F. C. Roll-to-Roll Inkjet Printing and Photonic Sintering of Electrodes for ITO Free Polymer Solar Cell Modules and Facile Product Integration. Adv. Energy Mater. 2013, 3, 172-175.
(2) Janoschka, T.; Teichler, A.; Hail pier, B.; Jah nert, T.; Hager, M. D.; Schubert, U. S. Reactive Inkjet Printing of Cathodes for Organic Radical Batteries. Adv. Energy Mater. 2013, 3, 1025-1028.
(3) Dua, V.; Surwade, S. P.; Ammu, S.; Agnihotra, S. R.; Jain, S.; Roberts, K. E.; Park, S.; Ruoff, R. S.; Manohar, S. K. All-Organic Vapor Sensor Using Inkjet-Printed Reduced Graphene Oxide. Angew. Chem., Int. Ed. 2010, 49, 2154-2157.
(4) Shin, K.-Y.; Hong, J.-Y.; Jang, J. Micropatterning of Graphene Sheets by Inkjet Printing and Its Wideband Dipole-Antenna Application. Adv. Mater. 2011, 23, 2113-2118.
(5) Schindler, A.; Brill, J.; Fruehauf, N.; Novak, J. P.; Yaniv, Z. Solution-Deposited Carbon Nanotube Layers for Flexible Display Applications. Phys. E (Amsterdam, Neth.) 2007, 37, 119-123.
(6) Singh, M.; Haverinen, H. M.; Dhagat, P.; Jabbour, G. E. Inkjet Printing-Process and Its Applications. Adv. Mater. 2010, 22, 673-685.
(7) Krebs, F. C.; Fyenbo, J.; Jørgensen, M. Product Integration of Compact Roll-to-Roll Processed Polymer Solar Cell Modules: Methods and Manufacture Using Flexographic Printing, Slot-Die Coating and Rotary Screen Printing. J. Mater. Chem. 2010, 20, 8994.
(8) Noh, J.; Yeom, D.; Lim, C.; Cha, H.; Han, J.; Kim, J.; Park, Y.; Subramanian, V.; Cho, G. Scalability of Roll-to-Roll Gravure-Printed Electrodes on Plastic Foils. IEEE Trans. Electron. Packag. Manuf. 2010, 33, 275-283.
(9) Kamyshny, A.; Magdassi, S. Conductive Nanomaterials for Printed Electronics. Small 2014, 10, 3515-3535.
(10) Reinhold, I.; Hendriks, C.; Eckardt, R.; Kranenburg, J.; Perelaer, J.; Baumann, R.; Schubert, U. Argon Plasma Sintering of Inkjet Printed Silver Tracks on Polymer Substrates. J. Mater. Chem. 2009, 19, 3384.
(11) Ma, S.; Bromberg, V.; Liu, L.; Egitto, F. D.; Chiarot, P. R.; Singler, T. J. Low Temperature Plasma Sintering of Silver Nano-particles. Appl. Surf. Sci. 2014, 293, 207-215.
(12) Ko, S. H. S. H.; Pan, H.; Grigoropoulos, C. P. C. P.; Luscombe, C. K. C. K.; Fréchet, J. M. J. J. M. J.; Poulikakos, D. All-Inkjet-Printed Flexible Electronics Fabrication on a Polymer Substrate by Low-Temperature High-Resolution Selective Laser Sintering of Metal Nanoparticles. Nanotechnology 2007, 18, 345202.
(13) Jang, S.; Lee, D. J.; Lee, D.; Oh, J. H. Electrical Sintering Characteristics of Inkjet-Printed Conductive Ag Lines on a Paper Substrate. Thin Solid Films 2013, 546, 157-161.
(14) Perelaer, J.; Abbel, R.; Wünscher, S.; Jani, R.; van Lammeren, T.; Schubert, U. S. Roll-to-Roll Compatible Sintering of Inkjet Printed Features by Photonic and Microwave Exposure: From Non-Conductive Ink to 40% Bulk Silver Conductivity in Less than 15 Seconds. Adv. Mater. 2012, 24, 2620-2625.
(15) www.metalprices.com.
(16) Deng, D.; Cheng, Y.; Jin, Y.; Qi, T.; Xiao, F. Antioxidative Effect of Lactic Acid-Stabilized Copper Nanoparticles Prepared in Aqueous Solution. J. Mater. Chem. 2012, 22, 23989.
(17) Grouchko, M.; Kamyshny, A.; Magdassi, S. Formation of Air-Stable Copper-silver Core-shell Nanoparticles for Inkjet Printing. J. Mater. Chem. 2009, 19, 3057.
(18) Rozenberg, G. G.; Bresler, E.; Speakman, S. P.; Jeynes, C.; Steinke, J. H. G. Patterned Low Temperature Copper-Rich Deposits Using Inkjet Printing. Appl. Phys. Lett. 2002, 81, 5249.
(19) Kamyshny, A. Metal-Based Inkjet Inks for Printed Electronics. Open Appl. Phys. J. 2011, 4, 19-36.
(20) Mallory, G. O.; Hajdu, J. B. Electroless Plating: Fundamentals and Applications: 1st ed; William Andrew: Norwich, N.Y., 1991.
(21) Busato, S.; Belloli, A.; Ermanni, P. Inkjet Printing of Palladium Catalyst Patterns on Polyimide Film for Electroless Copper Plating. Sens. Actuators, B 2007, 123, 840-846.
(22) Chang, Y.; Yang, C.; Zheng, X.-Y.; Wang, D.-Y.; Yang, Z.-G. Fabrication of Copper Patterns on Flexible Substrate by Patterning-Adsorption-Plating Process. ACS Appl. Mater. Interfaces 2014, 6, 768-772.
(23) Wang, M.-W.; Liu, T.-Y.; Pang, D.-C.; Hung, J.-C.; Tseng, C.-C. Inkjet Printing of a pH Sensitive Palladium Catalyst Patterns of ITO Glass for Electroless Copper. Surf. Coat. Technol. 2014, DOI: 10.1016/j.surfcoat.2014.02.031.
(24) Gysling, H. J. Nanoinks in Inkjet Metallization—Evolution of Simple Additive-Type Metal Patterning. Curr. Opin. Colloid Interface Sci. 2014, 19, 155-162.
(25) Zhu, P.; Masuda, Y.; Koumoto, K. Seedless Micropatterning of Copper by Electroless Deposition on Self-Assembled Monolayers. J. Mater. Chem. 2004, 14, 976.
(26) Lee, H.; Dellatore, S. M.; Miller, W. M.; Messersmith, P. B. Mussel-Inspired Surface Chemistry for Multifunctional Coatings. Science 2007, 318, 426-430.
(27) Yan, J.; Yang, L.; Lin, M.-F.; Ma, J.; Lu, X.; Lee, P. S. Polydopamine Spheres as Active Templates for Convenient Synthesis of Various Nanostructures. Small 2013, 9, 596-603.
(28) Ma, S.; Liu, L.; Bromberg, V.; Singler, T. J. Fabrication of Highly Electrically Conducting Fine Patterns via Substrate-Independent Inkjet Printing of Mussel-Inspired Organic Nano-Material. J. Mater. Chem. C 2014, 2, 3885.
(29) Deegan, R. D.; Bakajin, 0.; Dupont, T. F.; Huber, G.; Nagel, S. R.; Witten, T. A. Capillary Flow as the Cause of Ring Stains from Dried Liquid Drops. Nature 1997, 389, 827-829.
(30) Bromberg, V.; Ma, S.; Singler, T. J. High-Resolution Inkjet Printing of Electrically Conducting Lines of Silver Nanoparticles by Edge-Enhanced Twin-Line Deposition. Appl. Phys. Lett. 2013, 102, 214101.

(31) Liao, Y.-C.; Kao, Z.-K. Direct Writing Patterns for Electroless Plated Copper Thin Film on Plastic Substrates. ACS Appl. Mater. Interfaces 2012, 4, 5109-5113.

(32) M. Manceau, D. Angmo, M. Jørgensen, and F. C. Krebs, Org. Electron., 2011, 12, 566-574.

(33) M. Hilder, B. Winther-Jensen, and N. B. Clark, J. Power Sources, 2009, 194, 1135-1141.

(34) J. Yi, J. M. Lee, and W. II Park, Sensors Actuators B Chem., 2011, 155, 264-269.

(35) A. Rida, R. Vyas, and M. M. Tentzeris, IEEE Antennas Propag. Mag., 2009, 51, 13-23.

(36) K.-Y. Shin, J.-Y. Hong, and J. Jang, Adv. Mater., 2011, 23, 2113-8.

(37) S. Kim, H.-J. Kwon, S. Lee, H. Shim, Y. Chun, W. Choi, J. Kwack, D. Han, M. Song, S. Kim, S. Mohammadi, I. Kee, and S. Y. Lee, Adv. Mater., 2011, 23, 3511-6.

(38) Kim, Myong-Ki, et al. "Laser sintering of inkjet-printed silver nanoparticles on glass and PET substrates." Nanotechnology (IEEE-NANO), 2010 10th IEEE Conference on. IEEE, 2010.

(39) Allen, Mark L., et al. "Electrical sintering of nanoparticle structures." Nanotechnology 19.17 (2008): 175201.

(40) W.-S. Han, J.-M. Hong, H.-S. Kim, and Y.-W. Song, Nanotechnology, 2011, 22, 395705.

(41) S.-H. Wu and D.-H. Chen, J. Colloid Interface Sci., 2004, 273, 165-9.

(42) S. Gamerith, A. Klug, H. Scheiber, U. Scherf, E. Moderegger, and E. J. W. List, Adv. Funct. Mater., 2007, 17, 3111-3118.

(43) S. Wagner, IEEE Electron Device Lett., 2000, 21, 384-386.

(44) C.-C. Tseng, C.-P. Chang, Y. Sung, Y.-C. Chen, and M.-D. Ger, Colloids Surfaces A Physicochem. Eng. Asp., 2009, 339, 206-210.

(45) K. Akamatsu, S. Ikeda, H. Nawafune, and H. Yanagimoto, J. Am. Chem. Soc., 2004, 126, 10822-3.

(46) F. Bessueille, S. Gout, S. Cotte, Y. Goepfert, D. Leonard, and M. Romand, J. Adhes., 2009, 85, 690-710.

(47) Lee, Haeshin, et al. "Mussel-inspired surface chemistry for multifunctional coatings." Powerpoint "Mussel-inspired surface chemistry for multifunctional coatings" science.nchc.org.tw/old_science/nano_mems/nanomidtermreport/Mussel-inspired_surface_chemistry_for_multifunctional_coatings.ppt.

(48) Schaubroeck, David, et al. "Surface modification of a photo-definable epoxy resin with polydoparnine to improve adhesion with electroless deposited copper," Journal of Adhesion Science and Technology 26.1849 (2012): 2301-2314.

(49) Wang, Wencai, et al. "Surface silverized meta-aramid fibers prepared by bio-inspired poly (dopamine) functionalization." ACS applied materials & interfaces 5.6 (201 2062-2069.

(50) Mondin, Giovanni, et al. "Metal deposition by electroless plating on polydopamine functionalized micro- and nanoparticles." Journal of colloid and interface science 411 (2013): 187493.

(51) Schaubroeck, David, et al. "Surface characterization and stability of an epoxy resin surface modified with polyamines grafted on polydopamine." Applied Surface Science 303 (2014): 465-472.

(52) Schaubroeck, David, et al. "Surface modification of an epoxy resin with polyamines and polydopamine: The effect on the initial electroless copper deposition." Applied Surface Science 305 (2014): 321-329.

(53) Ma, Siyuan, et al. "Electroless copper plating of inkjet-printed polydopamine nanoparticles: a facile method to fabricate highly conductive patterns at near room temperature." ACS Applied Materials & interfaces (2014).

(54) Ma, Siyuan, et al, "Fabrication of highly electrically conducting fine patterns via. substrate-independent inkjet printing of mussel-inspired organic nano-material." Journal of Materials Chemistry C 0.20 (2014): 3885-3889.

(55) Schaubroeck, David, et al. "Surface modification of a photo definable epoxy resin with polyamines and polydopamine to improve adhesion with electroless deposited copper." 9th European Adhesion Conference (EURADH-2012). 2012.

(56) Liu, Chia-Ru, et al. "1, 10-Phenanthroline as an accelerator for Ag nanoparticle-catalysed electroless copper deposition." Applied Surface Science 317 (2014): 181-187.

(57) Fu, Ye, et al. "Highly Conductive One-Dimensional Nanofibers: Silvered Electrospun Silica Nanofibers via. Poly (dopamine) Functionalization." ACS applied materials & interfaces 6.7 (2014): 5105-5112.

(58) Jin, Yunxia, Dunying Deng, and Fei Xiao. "Site-selective fabrication of patterned transparent copper mesh on flexible substrates at mild temperature for green, low cost electronics." Electronic Components and Technology Conference (ECTC), 2013 IEEE 63rd. IEEE, 2013.

(59) Rzeznik, Maria Anna, et al. "Method for electroless metallization." U.S. Pat. No. 9,863,044, issued Jan. 9, 2008.

(60) Hu, Nan-Xing, Yu Qi, and Qi Zhang. "Metallization process for making fuser members." U.S. Pat. No. 7,976,692, issued Jul. 12, 2011.

(61) You, Jae Bern, et al. "A vapor-phase deposited polymer film to improve the adhesion of electroless-deposited copper layer onto various kinds of substrates," Langmuir 30.3 (2014): 916-921.

(62) Montazer, Majid, and Vida Allahyarzadeh. "Electroless plating of silver nanoparticles/nanolayer on polyester fabric using AgNO3/NaOH and ammonia." Industrial & Engineering Chemistry Research 52.25 (2013): 8436-8444.

(63) Wang, Wencai, et al. "Dopamine-induced surface functionalization for the preparation of Al—Ag bimetallic microspheres," Journal of the Electrochemical Society 158.4 (2011): D228-D233.

(64) Chien, Hsiu-Wen, et al. "Tunable micropatterned substrates based on poly (dopamine) deposition via microcontact printing." Langmuir 28.13 (2012): 5775-5782.

(65) Xu, Chunhua, et al. "Fabrication and properties of silverized glass fiber by dopamine functionalization and electroless plating." Journal of The Electrochemical Society 159.4 (2012): D217-D224.

(66) Guo, Chang, Lin Wang, and Maoguo Li. "Functionalization of Carbon Nanotubes with Copper for Nonenzymatic Electrochemical Detection of Glucose." Nanoscience and Nanotechnology Letters 6.6 (2014): 481-487.

(67) Yang, Haowei, et al. "Polydopamine-coated nanofibrous mats as a versatile platform for producing porous functional membranes." Journal of Materials Chemistry 22, 33 (2012): 16994-17001.

(68) Messersmith, Phillip B., and Haeshin Lee. "Surface-independent, surface-modifying, multifunctional coatings and application thereof." U.S. Pat. No. 8,541,060, issued Sep. 24, 2013.

(69) Messersmith, Phillip B., et al. "Surface Independent, Surface-Modifying, Multifunctional Coatings and Applications Thereof." U.S. Pat. No. 8,911,831, issued Dec. 16, 2014.

(70) Cong, Ying, et al. "Mussel-inspired polydopamine coating as a versatile platform for synthesizing polystyrene/Ag nanocomposite particles with enhanced antibacterial activities." *Journal of Materials Chemistry B* 2.22 (2014): 3450-3461.

(71) Cho, Hansang. "Biologically-inspired Microfluidic Platforms and Aptamer-based Nanobiosensors." (2010).

(72) Li, Qian, et al. "Facile preparation of $\alpha$-$Fe_2O_3$@ Ag core-shell structured nanoparticles." *Electrochimica Acta* 91 (2013): 114-121.

(73) Yunxia Jin, Yuanrong Cheng, Dunying Deng, Chengjie Jiang, Tianke Qi, Donglun Yang, and Fei Xiao, "Site-Selective Growth of Patterned Silver Grid Networks as Flexible Transparent Conductive Film by Using Poly (dopamine) at Room Temperature", ACS Appl. Mater. Interfaces, 2014, 6 (3), pp 1447-1453 (2014).

(74) V. Bromberg, S. Ma, F. D. Egitto, and T. J. Singler, *J. Mater. Chem. C*, 2013.

(75) V. Bromberg, S. Ma, and T. J. Singler, *Appl. Phys. Lett.*, 2013, 102, 214101.

(76) B. D. Cullity, *Elements of X-Ray Diffraction*, Addison-Wesley, 2nd edn., 1978.

(77) US20120104330, CHOI Yun Hyuk, BYUN Young Hun, LEE Jae Ho, KIM Suk Jun, "Metal Ink Composition, Method Of Forming A Conductive Metal Film Using The Same, And Conductive Metal Film Using The Same".

(78) U.S. Pat. No. 7,976,692, Hu Nan-Xing, Xi Yu, Zhang Xi, "Metallization process for making fuser members"

(79) U.S. Pat. No. 8,541,060 Messersmith Phillip B., Lee Haeshin, "Surface-independent, surface-modifying, multifunctional coatings and application thereof"

(80) U.S. Pat. No. 8,652,345 Moran Cristin Frey, Matthew H., Stay Matthew S., Pekurovsky Mikhail L., "Method Of Forming A Patterned Substrate"

(81) S M Kang, S Park, D Kim, S Y Park, R S Ruoff, H Lee, "Simultaneous Reduction and Surface Functionalization of Graphene Oxide by Mussel-Inspired Chemistry", Advanced Functional Materials, 2011

(82) J. Perelaer, P. J. Smith, D. Mager, D. Soltman, S. K. Volkman, V. Subramanian, J. G. Korvink, and U. S. Schubert, *J. Mater. Chem.*, 2010, 20, 8446.

(83) A. Solieman, A. H. Moharram, and M. A. Aegerter, Appl. Surf. Sci., 2010, 256, 1925-1929.

(84) J. J. P. Valeton, K. Hermans, C. W. M. Bastiaansen, D. J. Broer, J. Perelaer, U. S. Schubert, G. P. Crawford, and P. J. Smith, J. Mater. Chem., 2010, 20, 543.

(85) D. Tobjörk, H. Aarnio, P. Pulkkinen, R. Bollström, A. Määttänen, P. Ihalainen, T. Mäkelä, J. Peltonen, M. Toivakka, H. Tenhu, and R. Österbacka, Thin Solid Films, 2012, 520, 2949-2955.

(86) P. C. Hidber, W. Helbig, E. Kim, and G. M. Whitesides, *Langmuir*, 1996, 12, 1375-1380.

(87) B. R. Harkness, M. Rudolph, and K. Takeuchi, Chem. Mater., 2002, 14, 1448-1451.

(88) S. W. Suh, J. J. Kim, S. H. Kim, and B. K. Park, J. Ind. Eng. Chem., 2012, 18, 290-294.

(89) S. Busato, A. Belloli, and P. Ermanni, Sensors Actuators B Chem., 2007, 123, 840-846.

(90) P. Shah, Y. Kevrekidis, and J. Benziger, Langmuir, 1999, 15, 1584-1587.

(91) C.-C. Tseng, C.-P. Chang, Y. Sung, Y.-C. Chen, and M.-D. Ger, Colloids Surfaces A Physicochem. Eng. Asp., 2009, 339, 206-210.

(92) T. Zhang, X. Wang, T. Li, Q. Guo, and J. Yang, J. Mater. Chem. C, 2013.

(93) Q. Zhou, H. Chen, and Y. Wang, Electrochim. Acta, 2010, 55, 2542-2549.

(94) K. Akamatsu, S. Ikeda, H. Nawafune, and H. Yanagimoto, J. Am. Chem. Soc., 2004, 126, 10822-3.

(95) P. Zhu, Y. Masuda, and K. Koumoto, J. Mater. Chem., 2004, 14, 976.

(96) Y. Liao, B. Cao, W.-C. Wang, L. Zhang, D. Wu, and R. Jin, Appl. Surf. Sci., 2009, 255, 8207-8212.

(97) Hua Hu, Ronald Larson (2006). "Marangoni Effect Reverses Coffee-Ring Depositions". Journal of Physical Chemistry B 110 (14): 7090-7094. doi:10.1021/jp0609232. PMID 16599468.

(98) Eral H. B., Mampallil-Agustine D., Duits M. H. G., Mugele F. (2011). "Suppressing the coffee stain effect: how to control colloidal self-assembly in evaporating drops using electrowetting". Soft Matter 7 (7): 7090-7094. Bibcode:2011SMat....7.4954E. doi:10.1039/C1SM05183K.

(99) B. M. Weon and J. H. Je (2010). "Capillary force repels coffee-ring effect". Physical Review E 82: 015305(R). Bibcode:2010PhRvE..82a5305W. doi:10.1103/PhysRevE.82.015305.

(100) Bhardwaj et al. (2010). "Self-Assembly of Colloidal Particles from Evaporating Droplets: Role of DLVO Interactions and Proposition of a Phase Diagram". Langmuir 26 (11): 7833-42. doi:10.1021/la9047227. PMID 20337481.

(101) Xiaoying Shen, Chih-Ming Ho, Tak-Sing Wong (2010). "Minimal Size of Coffee Ring Structure". Journal of Physical Chemistry B 114 (16): 5269-5274. doi:10.1021/jp912190v. PMC 2902562. PMID 20353247.

(102) P. J. Yunker, T. Still, M. A. Lohr, A. G. Yodh (2011). "Suppression of the coffee-ring effect by shape-dependent capillary interactions". Nature 476 (7360): 308-311. Bibcode:2011Natur.476..308Y. doi:10.1038/nature10344.

(103) "Coffee-ring effect explained". ScienceDebate.com. Retrieved 21 Aug. 2011.

(104) B. G. Prevo, 0. D. Velev (2004). "Controlled rapid deposition of structured coatings from micro- and nanoparticle suspensions". Langmuir 20 (6): 2099-2107. doi:10.1021/la035295j.

(105) P. Kumnorkaew, Y. K. Ee, N. Tansu, J. F. Gilchrist (2008). "Investigation of the Deposition of Microsphere Monolayers for Fabrication of Microlens Arrays". Langmuir 24 (21): 12150-12157. doi:10.1021/la801100g.

(106) A. S. Dimitrov, K. Nagayama (1995). "Steady-state unidirectional convective assembling of fine particles into two-dimensional arrays". Chemical Physics Letters 243 (5-6): 462-468. Bibcode:1995CPL...243..462D. doi:10.1016/0009-2614(95)00837-T.

(107) Dongmao Zhang, Yong Xie, Melissa F. Mrozek, Corasi Ortiz, V. Jo Davisson, Dor Ben-Amotz (2003). "Raman Detection of Proteomic Analytes". Analytical Chemistry 75 (21): 5703-5709. doi:10.1021/ac0345087.

(108) Dongmao Zhang, Melissa F. Mrozek, Yong Xie, Dor Ben-Amotz (2004). "Chemical Segregation and Reduction of Raman Background Interference Using Drop Coating Deposition". Applied Spectroscopy 58 (8): 929-933. Bibcode:2004ApSpe..58..929Z. doi:10.1366/0003702041655430.

(109) Dongmao Zhang, Karthikeshwar Vangala, DongPing Jiang, Sige Zou, Tibor Pechan (2010). "Drop Coating Deposition Raman Spectroscopy of Fluorescein Isothiocyanate Labeled Protein". Applied Spectroscopy 64 (10): 1078-1085. Bibcode:2010ApSpe..64.1078Z. doi:10.1366/000370210792973497.

(110) B. M. Weon and J. H. Je (2013). "Self-pinning by colloids confined at a contact line". Physical Review Letters 110: 028303. Bibcode:2013PhRvL.110b8303W. doi:10.1103/PhysRevLett.110.028303.

What is claimed is:

1. A method for forming a conductive trace on a substrate wettable with a volatile liquid, comprising:
   providing a suspension of catalytic nanoparticles in the volatile liquid, the catalytic nanoparticles comprising a catalyst for electroless plating;
   selectively depositing the suspension of catalytic nanoparticles in the volatile liquid on the substrate by printing a line in a pattern having edges, wherein at least a portion of the substrate remains un-wet by the volatile liquid;
   drying the volatile liquid, to form a pattern of catalytic nanoparticles on the substrate, by evaporation of the volatile liquid to redistribute the catalytic nanoparticles according to the coffee ring effect to induce a higher concentration of catalytic nanoparticles in a first region on the substrate at the edges of the printed line and a sparse distribution of catalytic nanoparticles at a second region between the edges of the printed line, and wherein the un-wet portion of the substrate in a third region lacks catalytic nanoparticles; and
   selectively electroless plating the nanoparticles, to form a conductive metal pattern corresponding to a distribution of the formed pattern of catalytic nanoparticles in the first region, a non-conductive metal pattern corresponding to the distribution of the formed pattern of catalytic nanoparticles in the second region, and an absent metal pattern the third region.

2. The method according to claim 1, wherein the substrate comprises at least one of a polyimide sheet and glass.

3. The method according to claim 1, wherein the catalytic nanoparticles comprise polydopamine.

4. The method according to claim 1, wherein the suspension of catalytic nanoparticles is selectively deposited by a method selected from the group consisting of inkjet printing, lithography, and a pad printing process.

5. The method according to claim 1, wherein said drying comprises evaporating the volatile liquid in the suspension at an exposed surface in air.

6. The method according to claim 1, wherein the electroless plating comprises plating the catalytic nanoparticles with at least one of silver and copper.

7. The method according to claim 1, wherein the electroless plating forms a pair of separated conductive traces at the edges of an inkjet printed line of the catalytic nanoparticles.

8. The method according to claim 1, wherein the electroless plating comprises electroless copper plating, resulting in at least one continuous reduced copper trace on the substrate.

9. A patterned substrate having a conductive trace on a substrate wettable with a volatile liquid, formed by a method comprising:
   selectively depositing a suspension of catalytic nanoparticles in the volatile liquid, the catalytic nanoparticles comprising a catalyst for electroless plating, on the substrate by printing a line in a pattern having edges, wherein at least a portion of the substrate remains un-wet by the volatile liquid;
   drying the volatile liquid, to form a pattern of catalytic nanoparticles on the substrate, by evaporation of the volatile liquid to redistribute the catalytic nanoparticles according to the coffee ring effect to induce a higher concentration of catalytic nanoparticles in a first region on the substrate at the edges of the printed line and a sparse distribution of catalytic nanoparticles at a second region between the edges of the printed line, and wherein the un-wet portion of the substrate in a third region lacks catalytic nanoparticles; and
   selectively electroless plating the nanoparticles, to form a conductive metal pattern corresponding to a distribution of the formed pattern of catalytic nanoparticles in the first region, a non-conductive metal pattern corresponding to the distribution of the formed pattern of catalytic nanoparticles in the second region, and an absent metal pattern the third region.

10. The patterned substrate according to claim 9, wherein the substrate comprises at least one of a polyimide sheet and glass.

11. The patterned substrate according to claim 9, wherein the catalytic nanoparticles comprise polydopamine.

12. The patterned substrate according to claim 9, wherein the suspension of catalytic nanoparticles is selectively deposited by a method selected from the group consisting of inkjet printing, lithography, and a pad printing process.

13. The patterned substrate according to claim 9, wherein the electroless plating comprises plating the catalytic nanoparticles with at least one of silver and copper.

14. The patterned substrate according to claim 9, wherein the selectively depositing the suspension of catalytic nanoparticles comprises inkjet printing a line, to form a pair of separated conductive traces at the edges of the inkjet printed line.

15. The patterned substrate according to claim 9, wherein the electroless plating comprises electroless copper plating, resulting in at least one continuous reduced copper trace on the substrate.

16. A method for forming a conductive trace on a substrate, comprising:
   providing a suspension of catalytic nanoparticles adapted for electroless plating in a volatile liquid;
   depositing the suspension of catalytic nanoparticles on the substrate in a wetting pattern, wherein at least a portion of the substrate remains dry and absent catalytic nanoparticles;
   drying the volatile liquid, to selectively form a pattern of catalytic nanoparticles on the substrate corresponding to the wetting pattern, and having an inhomogeneous distribution of catalytic nanoparticles due to redistribution of the catalytic nanoparticles during the drying, comprising a dense region of catalytic nanoparticles at edges of the wetting pattern, and a sparse distribution of catalytic nanoparticles between the edges of the wetting pattern, and a region that remained dry outside the wetting pattern without catalytic nanoparticles; and
   electroless plating the catalytic nanoparticles, to form a conductive metal pattern corresponding to the inhomogeneous distribution of the catalytic nanoparticles, comprising a conductive metallized region corresponding to the dense region, and a non-conductive region corresponding to the sparse distribution, separating portions of the conductive metallized region.

17. The method according to claim 16, wherein the catalytic nanoparticles comprise polydopamine.

18. The method according to claim 16, wherein the suspension of catalytic nanoparticles is selectively deposited by a method selected from the group consisting of inkjet printing, lithography, and a pad printing process.

19. The method according to claim 16, wherein the electroless plating comprises plating the catalytic nanoparticles with at least one of silver and copper.

20. The method according to claim 19, wherein the electroless plating forms a pair of separated conductive traces at the edges of an inkjet printed line of the catalytic nanoparticles.

* * * * *